US012800353B2

(12) United States Patent
Unterschultz et al.

(10) Patent No.: US 12,800,353 B2
(45) Date of Patent: Nov. 17, 2026

(54) CAPACITIVE POSITION SENSING

(71) Applicants: Chad Unterschultz, Edmonton (CA); Kai Unterschultz, Edmonton (CA)

(72) Inventors: Chad Unterschultz, Edmonton (CA); Kai Unterschultz, Edmonton (CA)

( * ) Notice: Subject to any disclaimer, the term of this patent is extended or adjusted under 35 U.S.C. 154(b) by 129 days.

(21) Appl. No.: 16/415,332

(22) Filed: May 17, 2019

(65) Prior Publication Data

US 2019/0360843 A1 Nov. 28, 2019

Related U.S. Application Data

(60) Provisional application No. 62/674,989, filed on May 22, 2018.

(51) Int. Cl.
*G01D 5/241* (2006.01)
*G01D 18/00* (2006.01)
*G01R 27/26* (2006.01)

(52) U.S. Cl.
CPC .......... *G01D 5/2415* (2013.01); *G01D 18/00* (2013.01); *G01R 27/2605* (2013.01)

(58) Field of Classification Search
CPC .......... G01D 5/2415; G01D 5/00; G01D 5/12; G01D 5/14; G01D 5/24; G01D 5/241; G01D 5/2412; G01D 5/26; G01D 5/32; G01D 5/34; G01D 5/347; G01D 18/00; G01R 27/00; G01R 27/02; G01R 27/26; G01R 27/2605
USPC .......................... 324/600, 649, 658, 661, 662
See application file for complete search history.

(56) References Cited

U.S. PATENT DOCUMENTS

| | | | |
|---|---|---|---|
| 3,857,092 | A | 12/1974 | Meyer |
| 4,420,754 | A | 12/1983 | Andermo |
| 4,423,417 | A | 12/1983 | Tanaka et al. |
| 4,437,055 | A | 3/1984 | Meyer |

(Continued)

FOREIGN PATENT DOCUMENTS

EP 0248165 A2 * 12/1987 .......... G01D 5/2415

OTHER PUBLICATIONS

"A Simple Capacitive Displacement Sensor", Sensors and Actuators A, 25-27, 1991, F. Zhu and J.W. Spronck, pp. 265-269.

(Continued)

*Primary Examiner* — Hoai-An D. Nguyen

(57) ABSTRACT

A capacitive displacement sensor with a plurality of pathways. Groupings are emitter and or receiver units that are physically separate and not intermixed. Pathways may be standard or specialized in nature. Standard pathways are primarily used to detect displacement. Specialized pathways are primarily used to detect features other than displacement. Multiple pathways enable choice between displacement data, as well as optimization and discernment. Discernment refers to detecting errors and defects in or on the scale, also known as irregularity detection. Irregularity detection then allows for irregularity avoidance, irregularity recognition, irregularity acquisition and irregularity adaptation. Specialized pathways enable prescanning and data adjustment. Since irregularities can be sufficiently detected, intentional irregularities can be put in or on the scale. Intentional irregularities can be detected and interpreted for absolute position and or directional information.

13 Claims, 19 Drawing Sheets

(56) References Cited

U.S. PATENT DOCUMENTS

| | | | | | |
|---|---|---|---|---|---|
| 4,543,526 | A * | 9/1985 | Burckhardt | G01D 5/2415 | 324/660 |
| 4,636,792 | A | 1/1987 | Watson | | |
| 4,638,249 | A | 1/1987 | Tanaka et al. | | |
| 4,694,275 | A | 9/1987 | Cox | | |
| 4,743,838 | A | 5/1988 | Eckerle | | |
| 4,743,902 | A | 5/1988 | Andermo | | |
| 4,788,546 | A | 11/1988 | Sasaki | | |
| 4,841,225 | A | 6/1989 | Meyer | | |
| 4,878,013 | A | 10/1989 | Andermo | | |
| 4,879,508 | A | 11/1989 | Andermo | | |
| 4,882,536 | A | 11/1989 | Meyer | | |
| 5,304,937 | A | 4/1994 | Meyer | | |
| 5,352,938 | A * | 10/1994 | Wise | G01D 5/24476 | 327/72 |
| 5,574,442 | A | 11/1996 | Kinoshita et al. | | |
| 5,598,153 | A | 1/1997 | Brasseur et al. | | |
| 5,731,707 | A * | 3/1998 | Andermo | G01D 5/2415 | 324/660 |
| 5,977,781 | A | 11/1999 | Jordil | | |
| 6,072,318 | A * | 6/2000 | Jordil | G01D 5/2415 | 324/660 |
| 6,483,321 | B2 | 11/2002 | Brasseur | | |
| 6,892,590 | B1 | 5/2005 | Andermo | | |
| 8,638,108 | B2 * | 1/2014 | Nielsen | A61M 5/31525 | 324/662 |
| 8,854,054 | B2 | 10/2014 | Ludwig | | |
| 2005/0092108 | A1 | 5/2005 | Andermo | | |
| 2009/0002148 | A1 * | 1/2009 | Horvitz | G08G 1/0112 | 340/514 |
| 2015/0268790 | A1 | 9/2015 | Meyer | | |
| 2016/0102998 | A1 * | 4/2016 | Romer | G01D 5/34753 | 324/207.25 |
| 2016/0161292 | A1 * | 6/2016 | Rohner | G01D 5/2415 | 324/662 |
| 2016/0341762 | A1 * | 11/2016 | Waters | G01P 15/125 | |
| 2017/0344417 | A1 * | 11/2017 | Kobayashi | G01D 5/24495 | |
| 2018/0216971 | A1 * | 8/2018 | Kawatoko | G01D 5/2415 | |

OTHER PUBLICATIONS

"A New Linear Encoder-Like Capacitive Displacement Sensor", Measurement, V39, 2006, Moojin Kim, Wonkyu Moon, pp. 481-489.

"A New Capacitive Displacement Sensor with High Accuracy and Long-Range", Sensors and Actuators A, 130-131, 2006, Moojin Kim et al, pp. 135-141.

"A Time-Grating Sensor for Displacement Measurement with Long Range and Nanometer Accuracy", IEEE Transactions on Instrumentation and Measurement, vol. 64, No. 11, Nov. 2015, . . . Ziran Chen et al, pp. 3105-3115.

"A Novel Single-Excitation Capacitive Angular Position Sensor Design", Sensors (Basel), 2016;16(8):1196, Bo Hou et al.

"Efficient Design of Capacitive Sensors Using Conformal Maps", 2012 IEEE International Instrumentation and Measurement Technology Conference Proceedings, . . . Graz, 2012, N. Eidenberger, S. Wiesmueller and B. G. Zagar, pp. 1308-1313.

"An Analytical Fringe Capacitance Model for Interconnects Using Conformal Mapping", IEEE Transactions on Computer-Aided Design of Integrated Circuits and Systems, . . . vol. 25, No. 12, Dec. 2006, Aditya Bansal et al, pp. 2765-2774.

* cited by examiner

*FIG. 1* *– Prior Art –*

CAPACITIVE POSITION SENSING

BACKGROUND OF THE INVENTION

Without a doubt, measurement is important, and by extension, measurement devices. However, measurement devices are also important for another reason. Control systems use sensors extensively. A control system, in accordance to its namesake, uses available historical and current data to make decisions. The better the sensor data, the better the performance.

Capacitive sensing techniques are very popular because they tend to use relatively simple parts and components. For instance, many capacitive encoders are specially designed pads on a printed circuit board, or PCB. Since PCB's can be mass produced with high accuracy and low cost, capacitive sensors are a desirable sensing method.

Capacitive Sensing: Prior Art Many different capacitive position sensing techniques are outlined in FIG. 1, General Concepts Overview Map. The figure attempts to show a block diagram of underlying concepts and ideas, as well as to provide examples of these concepts in prior art patents. This is part of a description of the known information and the state of existing technology. Please note that dashed boxes illustrate relevant patents. Solidly outlined boxes highlight concepts. Lines between solid boxes indicate that the ideas connect or give way to one another. An idea will typically give way to another from top to bottom. For instance, linear sensors give way to linear interpolation and connect to wired interpolation approaches.

The general topics outlined in FIG. 1 need to be reviewed to lay the groundwork of the state of technology. To do that efficiently, the prior art has been summarized according to topic:

1. Linear Sensors (A0)
2. Threshold Counting (B0)
3. Interpolation (C0)
4. Wired Capacitive Sensor Basics (D0)
5. Wireless Capacitive Sensor Basics (E0)
6. Phase Modulation (F0)
7. Same Signal Phase Modulation (G0)
8. Orthogonal Signal Phase Modulation (H0)
9. Differential (I0)
10. Shield Electrode and Signal Balanced Shield Electrodes (J0)
11. Multiple Electrodes (K0)
12. Absolute Positioning (L0)
13. Phase Construction (M0)

There are also six scientific papers that explore topics relevant to capacitive sensing. These will be discussed later in the State of Technology: Scientific Papers section. An exhaustive list of prior art can be found listed in the references cited section.

State of Technology: General Concepts

To understand where capacitive sensing can be taken, it is important to see where capacitive sensing has come from. For this reason, it is useful to briefly review the state of technology.

1. Linear Sensors (A0)

Linear sensing refers to the core assumptions that different sensors use. Linear capacitive position sensors refer to the capacitance being driven by the parallel plate effect. The capacitance is directly and linearly proportionate to the overlapping area between two (or more) electrodes that form the capacitor.

2. Threshold Counting (B0)

Some sensors count discrete capacitive highs and lows. Each high or low represents one increment or threshold. Sensors can use these discrete increments to determine or help determine position.

3. Interpolation (C0)

Interpolation refers to estimating or evaluating position between maxima or minima thresholds.

4. Wired Capacitive Sensor Basics (D0)

Capacitive sensors typically have emitter(s) and receiver (s). In a wired sensor, either the emitter is placed on the scale and the receiver on the slider, or vice versa.

5. Wireless Capacitive Sensor Basics (E0)

The inherit limitations of wired sensors was overcome by way of capacitive coupling. Capacitive coupling implies that separate conductive pads(s) are placed between emitter and receiver pad(s). The signal pathway between pads is: emitter—separate conductive pads—receiver. Often times, separate conductive pads are part of a scale. The emitter and receiver pads are typically part of the slider. As the scale moves relative to the slider, the capacitive coupling changes.

6. Phase Modulation (F0)

Phase modulation is a common capacitive sensing approach used in various encoders. Multiple signals are emitted at different positions. These signals may be of the same type but different phase. This can be called Same Signal Phase Modulation (G0). These signals may also be of different type. This can be called Orthogonal Signal Phase Modulation (H0).

As the slider moves, it lines up differently with the scale. This occurs periodically along the length of the scale. The receiver(s) will sense a waveform that is a combination or superposition of these emitted signals. Depending on where the sensor is, that combination will vary. For instance, there may be three emitted signals, A, B and C. Sometimes the received signal will be more like A, B, C or somewhere in-between any two signals.

How much the received signal is like A, or B or C defines the signal phase. The signal phase can be compared to a reference phase to determine position. A situation with three emitted phases and one received signal is modeled here:

$$\text{Signal0} = A1(x)\cdot\text{Signal1} + A2(x)\cdot\text{Signal2} + A3(x)\cdot\text{Signal3}$$

In this equation, Signal1, Signal2 and Signal3 are emitted signals. Signal0 is a received signal based on the capacitive coupling of each emitted signal with the receiver. As the sensor moves, the capacitive coupling changes. As the capacitive coupling changes, the contribution of each emitted signal to the received signal changes. This change is reflected in components A1($x$), A2($x$) and A3($x$). Each signal's respective contribution to or amplitude in Signal0 is modeled by these A(x) position dependent coefficients.

7. Same Signal Phase Modulation (G0)

Same signal phase modulation implies that each emitted signal is of the same shape. That shape may be square, sinusoidal, saw-tooth or some other distinct shape. The phase refers to the emitted signals varying in time delay. Usually each emitted signal is somewhere from 0 to 360 degrees out of phase relative to the other signal(s). For example: a sensor may have phases A, B and C. Phase A may be at 0 degrees of phase. Phase B may be at 120 degrees of phase. Phase C may be at 240 degrees of phase. In this example, the receiver will see a single waveform that is some superposition of the emitted signals. This single waveform will vary anywhere from 0 to 360 degrees in phase. Of course, the pattern repeats every 360 degrees. The sensor will evaluate the position based directly on comparing the received signal phase to a reference phase.

8. Orthogonal Signal Phase Modulation (H0)

Orthogonal signal phase modulation implies that each emitted signal is of different shape or type. Signals are orthogonal to one another in time and or frequency. The receiver sees some superposition of the emitted signals. The sensor will evaluate position based directly on decomposing the received signal into its constituent parts.

The relative intensity of each constituent signal defines the phase.

For example:

Consider two emitted signals, A and B. Sometimes the received signal would be entirely A, entirely B or some superimposed combination. The relative superposition or ratio of one signal to another is effectively a phase.

The phase can be evaluated because the emitted signals are orthogonal. The received signal can be disentangled into its constituent parts. From this, relative intensity and phase can be determined, and position evaluated.

It is also important to note that a sensor based on emitted signals of different frequency is essentially a Frequency Modulation sensor.

9. Differential (I0)

Differential is similar to the concept of twisted pair common mode rejection. The emitted signals are often split into pairs. For instance, signal A may become A+ and A−. The A+ and A− signals are spaced close together, so that any noise impacts both similarly or effectively the same.

Differential is typically done by doubling the number of emitted signals. Each emitted signal will have a positive and negative half. The number of unique receivers is also doubled, into pairs. Typically, each received signal pair subtracts the received positive and negative signals from one another:

$$(A+)-(A-)=2A$$

This subtraction eliminates or reduces common mode noise. This boosts Signal to Noise Ratio (SNR) of the device.

10. Shield Electrode and Signal Balanced Shield Electrodes (J0)

Shield electrode sensors have emitter(s) and receiver(s). A cover or shield is between these elements. This cover blocks or changes the capacitive coupling by what is covered and uncovered.

Differential techniques give way to signal balanced shield electrodes. The assumption here is that the shield electrode is floating independent of a DC ground. Clever geometry design choices allow all emitter pads to be equally exposed to the shield at all times. Thus the shield is balanced to all emitted signals. The shield, being exposed to balanced emitted signals should always have a constant DC value potential. In this way, it can block electric field lines without a physical ground, neutral or DC connection. The shield acts to cover and uncover the emitter pads in a specific way as it moves along. Phase—modulation techniques can be used with the added benefit of this covering shield.

11. Multiple Electrodes (K0)

Many capacitive sensors have more than one receiver electrode. Electrodes may be in successive groups. These groups may be evenly spaced in some periodic or non-periodic manner. Having multiple electrodes serves several useful purposes:

I. Multiple electrodes can be used to check for faults or errors, as seen in US patents like 4'743'902. There are two side by side electrodes. A measurement from one electrode is compared to the measurement from another electrode. If the two measurements are not in agreement, then there is a problem and the user if flagged.

II. Some position measurement techniques use the difference between any two measurements to obtain position information, like in US patent US 8'854'054 B2.

III. Use of multiple electrodes can enable the input signal to be of differential type. Examples of this can be seen in US patents like 4'420'754, 4'743'838, 5'304'937, US 2005/0092108 A1 and US 6'892'590 B1.

IV. Multiple pads in parallel can increase the Signal to Noise Ratio (SNR) by increasing capacitive coupling, like in the cited paper "A Simple Capacitive Displacement Sensor", published in the 1991 journal of *Sensors and Actuators* by F. Zhu and J. W. Spronck and can be seen in many US patents, like 4'743'902, 4'788'546, 4'841'225, 4'879'508, 5'977'781, US 2005/0092108 A1 and US 6'892'590 B1.

V. Random defects can be a source of error. The impact of these defects can be averaged out by having periodic electrode pads connected in parallel. This is discussed in papers like "A Simple Capacitive Displacement Sensor," published in the 1991 journal of *Sensors and Actuators* by F. Zhu and J. W. Spronck, as well as some US patents, like in 4'743'838.

VI. Systematic defects can be sources of error. The impact of these defects can be reduced by having electrodes spaced in non-periodic patterns. This is discussed in more detail in the US patent 5'977'781.

VII. Multiple pads can increase sensor resolution by implementing the vernier effect. Resolution is theoretically increased by staggering pads at different intervals, like in US patent 5'304'937.

12. Absolute Positioning (L0)

Capacitive sensors tend to use principles that lead to relative information. For instance, phase modulation sensors measure relative position in any given period. Each period occurs across some interval of spatial distance. To make this type of sensor more accurate, one generally needs to shorten the size of each interval. The shorter the interval, the greater the total number of intervals along the length. Each interval will be indistinguishable from every other interval. As the number of repeating intervals increase, determining absolute position becomes a problem.

To circumvent this problem, many sensors index against a reference. However, there are many circumstances when the sensor may not be indexed against a reference or may lose that indexing. In these cases, the sensor does not know its absolute position. Recall, a greater number of total intervals will make it less clear which interval the sensor is in.

To summarize:

- To know position absolutely, one needs to be referenced to an absolute starting position
- The system will have to continuously monitor its position relative to this absolute starting position. If, for example, power is interrupted while the slider is moving, the absolute starting reference would be lost. After every use, the sensor will need to be continuously powered, or the slider locked in place or referenced before each next use.

Some absolute positioning methods allow the sensor to operate with the same or similar relative exactness, except without the need to re-reference the sensor.

How has this been achieved?

The author of US patents 4'420'754 and 4'879'508 proposes a simple method. The author proposes the use of two different phase patterns. The scale has two rows (or perhaps more). Each row has a different pad spacing. Since each row has a different spacing, both rows incur phase at different rates. This difference is slight. Sometimes the two signals, one from each row, are similar in phase. Sometimes the two signals are very different in phase. The difference between the rows is a higher order waveform embedded into the scale. This higher order waveform provides absolute position information.

Other authors have proposed similar solutions. For instance, US patent US 6'892'590 B1 proposes embedding a higher order waveform in a circular encoder, using a second row; this encoder is circular instead of linear. One row (or ring) is for relative and the other for absolute position information.

Using multiple rows is a simple way to add additional information to the sensing. This addition, however, requires additional space for the different rows, not to mention the additional electrical hardware required. Also, authors often use multiple rows for differential filtering. The extra space required for the extra rows for differential and for absolute positioning could cause space limitation pressures.

13. Phase Construction (M0)

Phase construction involves receiving one net waveform through multiple measurements. A single signal is emitted. Many different receiving electrodes or electrode sets are used to measure the capacitive distribution. The one net waveform is constructed by the superposition of these many measurements. The phase or position of this net waveform determines the sensor position measurement.

SUMMARY

Concepts (1.) to (13.) are common building block concepts that can and have been used in the creation of existing encoders.

State of Technology: Scientific Papers

A focus of the invention is around capacitive principles. There are several existing prior art examples where authors discuss capacitive sensing concepts. It is important to review these documents to establish the state of the prior art.

"A Simple Capacitive Displacement Sensor", published in the 1991 journal of *Sensors and Actuators* by F. Zhu and J. W. Spronck—the authors of this paper propose a wired, phase construction type, capacitive sensor. In this paper, the authors create a sensor with micrometer sized plates. By taking eight, side by side measurements, the authors reconstruct an overall pseudo-sinusoidal waveform. Provided the electric field distribution or waveform shape varies in some discernible way, then the waveform phase can be detected. The phase corresponds to relative position.

"A New Linear Encoder-Like Capacitive Displacement Sensor", published in the 2006 *Measurement journal*, V39, by Moojin Kim, Wonkyu Moon, pp 481-489, and "A New Capacitive Displacement Sensor with High Accuracy and Long-Range", published in the 2006 *Sensors and Actuators* A journal, 130-131, by Moojin Kim et al, pp 135-141—both papers discuss the same or similar wired, contact based capacitive sensor. Capacitance is measured using an impedance analyzer. The capacitance is then correlated with a position. The authors discuss a fundamental aspect of capacitive sensing: fringing, linearity and sensitivity is dependent on the gap between the scale and the slider. In order to maximize the sensor performance, the author's propose minimizing and stabilizing the gap distance. To achieve a more stable thin gap, a hyperthin diamond like coating was used. The slider and scale are both coated, then pressed against one another. In doing this, the sensor performance is maximized.

"A Time-Grating Sensor for Displacement Measurement with Long Range and Nanometer Accuracy", published in the 2015 IEEE Transactions on Instrumentation and *Measurement journal* by Ziran Chen et al, pp 3105-3115—this paper proposes a wired, micrometer sized differential phase modulation capacitive sensor. The author's base assumption is linear (parallel plate), that capacitance is linearly related to area overlap, and that the position linearly correlates with capacitance. The authors note that sensor pad and gap dimension ratios have a large impact on sensor performance, particularly gap size and pad spacing. These results agree similarly with the results found in "A New Linear Encoder-Like Capacitive Displacement Sensor", published in the 2006 *Measurement journal*, V39, by Moojin Kim, Wonkyu Moon, pp 481-489, and "A New Capacitive Displacement Sensor with High Accuracy and Long-Range", published in the 2006 *Sensors and Actuators* A journal, 130-131, by Moojin Kim et al, pp 135-141.

"A Novel Single-Excitation Capacitive Angular Position Sensor Design", published in the 2016 Sensors (Basel) journal by Bo Hou et al—this paper proposes a differential, phase modulation radial encoder. The sensor also appears wireless in nature. The author's base assumption is linear (parallel plate). The authors note a repeating, pseudo-sinusoidal error. By measuring the non-linearity, the authors create a correction equation. This correction equation increases the positioning accuracy from about 0.25 degrees to about 0.008 degrees.

BRIEF SUMMARY OF THE INVENTION

Capacitive position sensors and encoders need to be precise and accurate. They need to operate predictably and provide repeatable measurements. Authors in prior art have explored a number of topics, methods and approaches to fulfill these goals.

The present invention proposes the following improvements:

- Multiple Groupings—multiple groups provides choice. Choice enables the opportunity for data collection optimization. Choice, as specifically outlined in this section also enables irregularity detection, irregularity recognition, irregularity avoidance, irregularity adaptation and data selection optimization. Other benefits also exist.
- Specialized Pads—capacitive behavior and fringing knowledge makes it possible to create specialized pads for the purpose of deriving specialized information and updating position information. Subsequently, specialized pads can be used in conjunction with grouping(s) to develop specialized prescanning. These pads can be used to provide shielding. They also simplify irregularity detection, adaptation, avoidance and alerts. Other benefits also exist
- Absolute Positioning—unique features will leave or imbue unique signatures on the capacitive waveform. Capacitive waveform knowledge enables the detection of and discernment between unique features. This enables concise and streamlined absolute position sensing or marker detection. Other benefits are also possible.
- Embedded Components—feature detection can also be extended for the detection of unique components embedded into the scale.

to help enhance and improve capacitive sensor operation, performance, irregularity resilience and data optimization.

(A0) represents the concept of Linear Sensors. (B0) represents the concept of Threshold Counting. (B1) represents patents that embody principle (B0). (C0) represents the concept of Interpolation. (D0) represents the concept of Wired Capacitive Sensor Basics. (D1) represents a patent that embodies principle (D0). (E0) represents the concept of Wireless Capacitive Sensor Basics. (F0) represents the concept of Phase Modulation. (F1) represents patents that embody principle (F0). (G0) represents the concept of Same Signal Phase Modulation. (G1) represents patents that embody principle (G0). (H0) represents the concept of Orthogonal Signal Phase Modulation. (H1) represents patents that embody principle (H0). (I0) represents the concept of Differential. (I1) represents patents that embody principle (I0). (J0) represents the concept of Shield Electrode and Signal Balanced Shield Electrodes. (J1) represents patents that embody principle (J0). (K0) represents the concept of Multiple Electrodes. (K1) represents patents that embody principle (K0). (L0) represents the concept of Absolute Positioning. (L1) represents patents that embody principle (L0). (M0) represents the concept of Phase Construction. (M1) represents patents that embody principle (M0).

The patent numbers in the figure are: 4'420'754, 4'743'902, 4'879'508, 5'304'937, 6'483'321, 2005/0092108, 6'892'590, 3'857'092, 4'841'225, 4'882'536, 4'694'275, 4'743'838, 5'977'781, 4'788'546 and 5'598'153.

Figure 1:
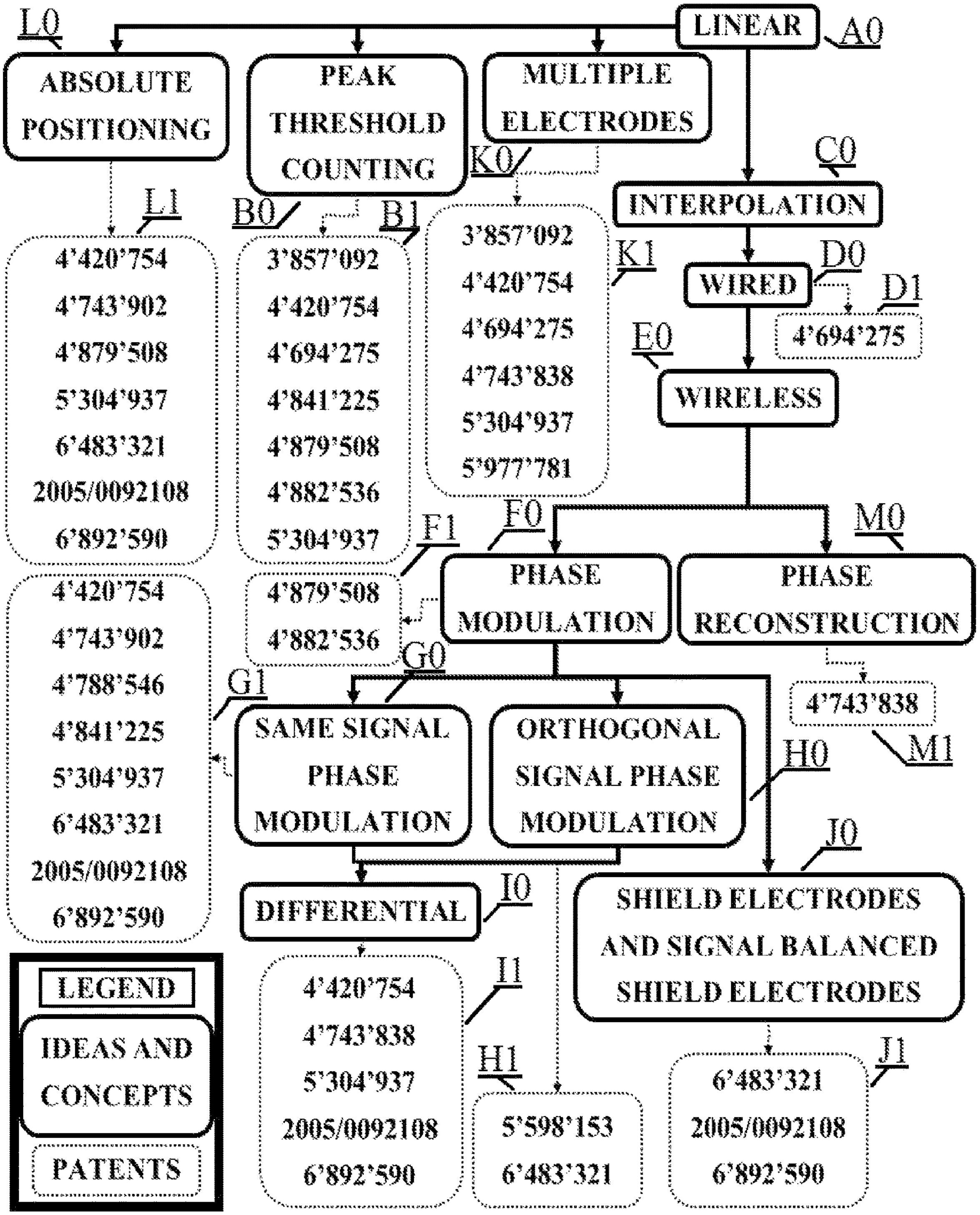
FIG. 1—shows a map of general prior art concepts, connections and examples.
Figure 2:
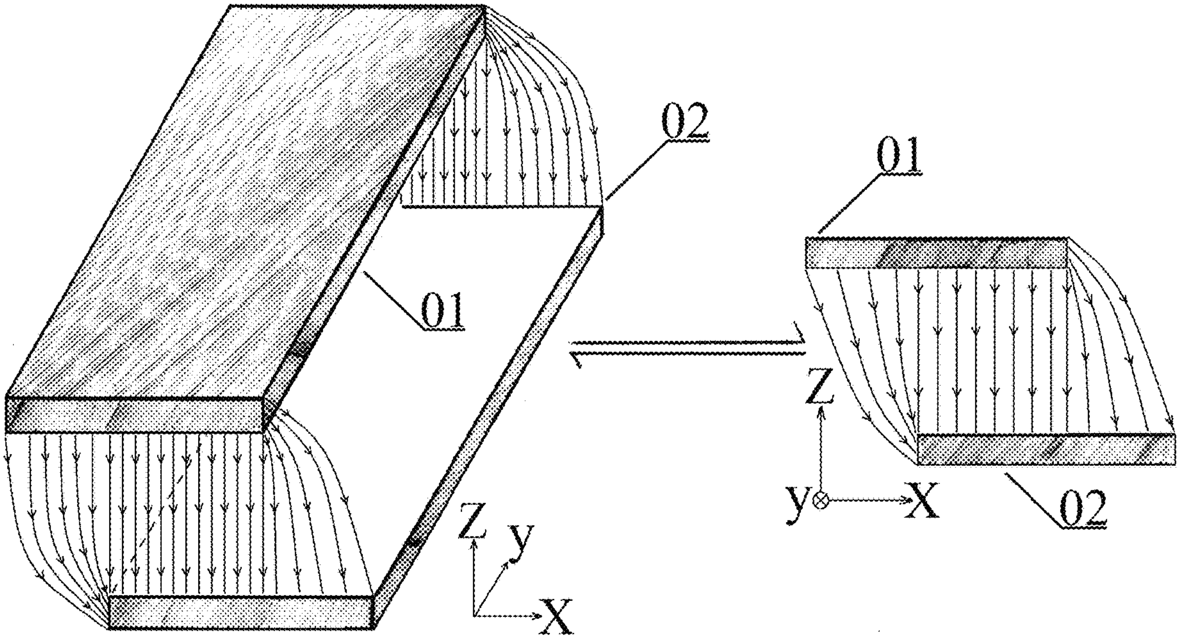

FIG. 2—shows a visualization of electric field line paths, from an isometric perspective (left) and end on view (right). A capacitor is formed from surfaces (01) and (02), an anode and cathode respectively. The electric field lines visualize the combination of simple parallel plate and various fringing effects. This figure is not intended to represent actual field line density.

Figure 3:
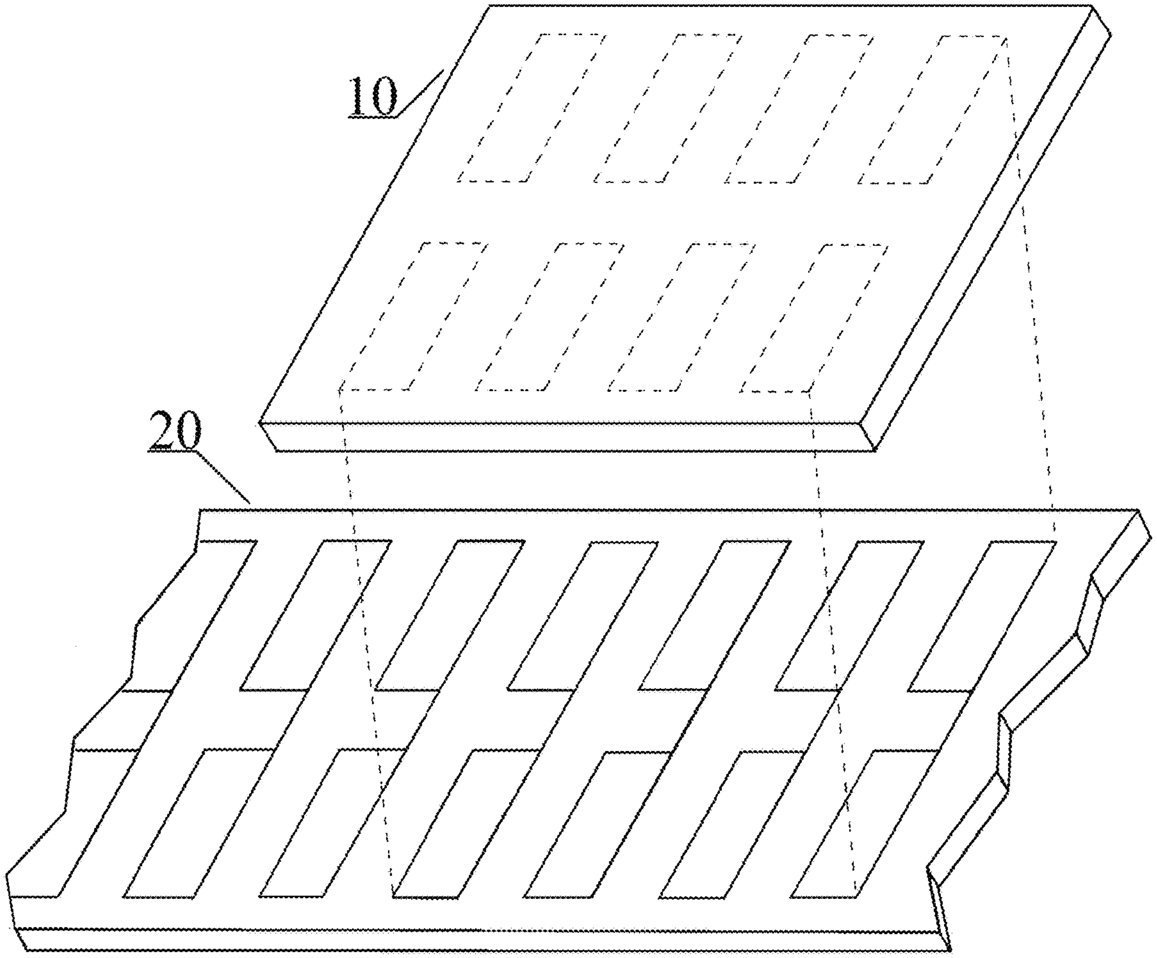

FIG. 3—shows a simplified visualization of the proposed sensor, with (10) being a slider, moving along or over-top of a scale, (20). The associated circuitry (microcontroller, digital logic circuits, analog circuits, etc) are not shown for simplicity but would likely be located on or in the slider. The mechanical structure that the slider and scale attach to is not shown for simplicity and should be well understood by someone skilled in the art of capacitive sensing.

Figure 4:
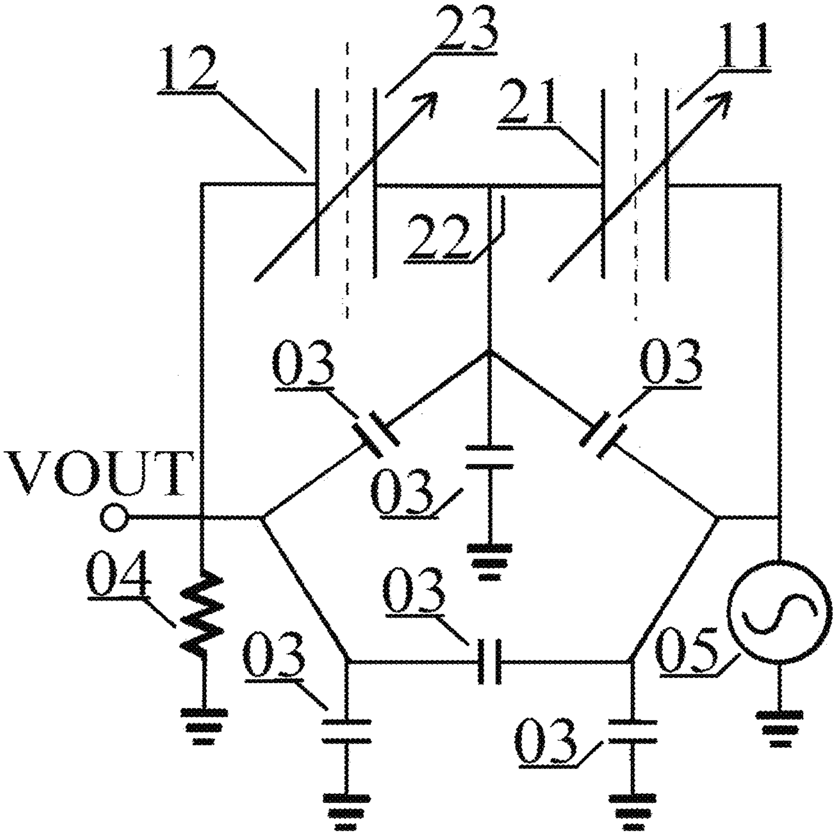
Figure 5:
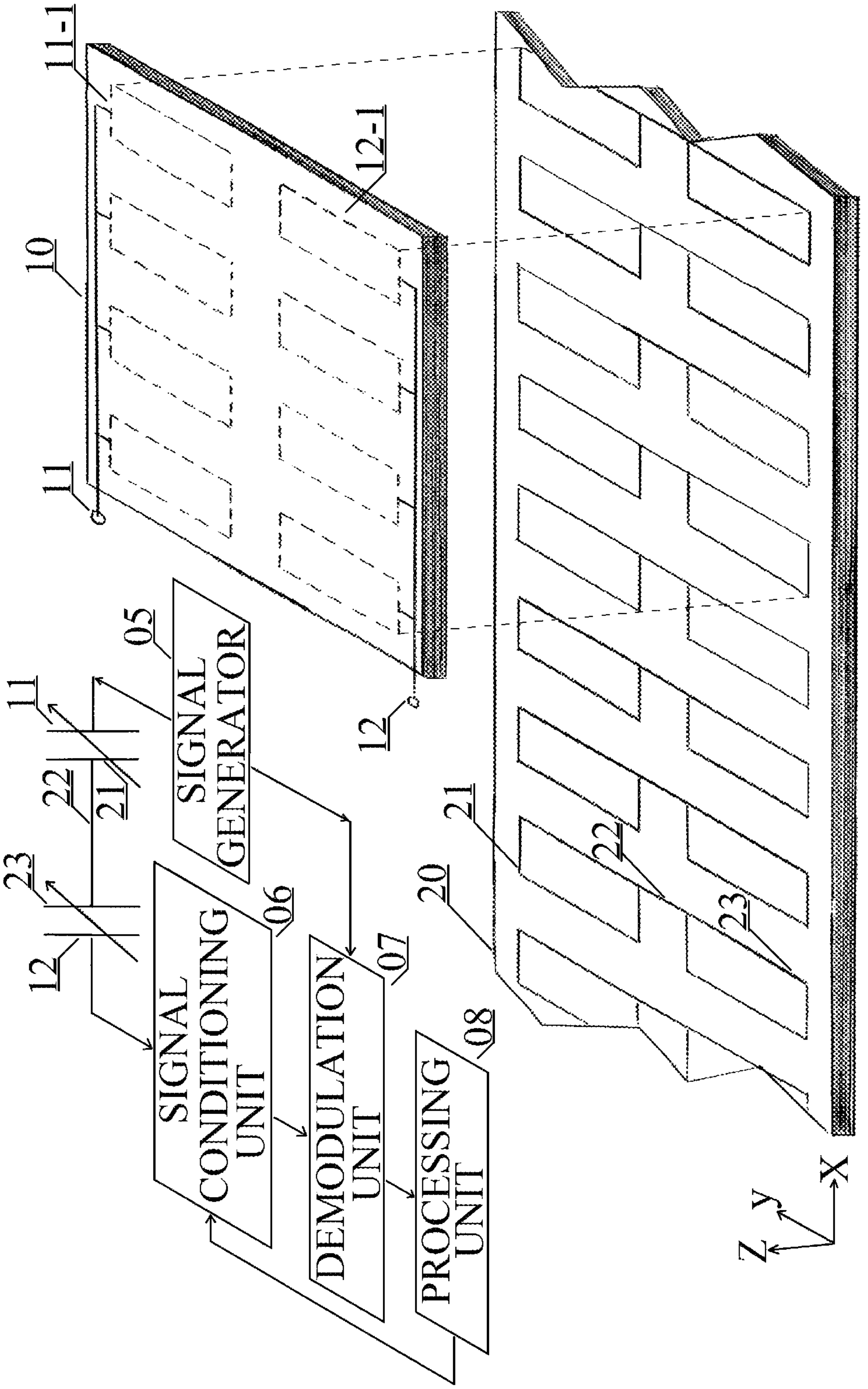

FIG. 4—shows one possible circuit representation or embodiment of the sensor described in FIG. 3 and FIG. 5. Component (03) describes any undesirable capacitive effects, like cross capacitance and parasitic capacitance. These undesirable capacitive effects are neglected from future diagrams for simplicity. (11) refers to emitter pad(s). (12) refers to receiver pad(s). (21) is the part of a scale pad or segment that capacitively couples with (11). (22) is the part of a scale pad or segment that conductively connects (21) and (23). (23) is the part of a scale pad or segment that capacitively couples with (12). Component (05) is a Signal Generator that energizes (11). (04) is the load impedance visualized here as a resistor. (VOUT) refers to the received signal being measured.

FIG. 5—shows two things: 1, an operational block diagram of how the electronics interface with the pads (left), and 2, how those pads could be arranged spatially (right and lower). Component (05) is the Signal Generator. Component (06) is the Signal Conditioning Unit. Component (07) is the Demodulation Unit. Component (08) is the Processing Unit for processing Nonlinear Signals. Component (11-1) is an emitter pad that makes up (11). Component (12-1) is a receiver pad that makes up (12).

Figure 6:
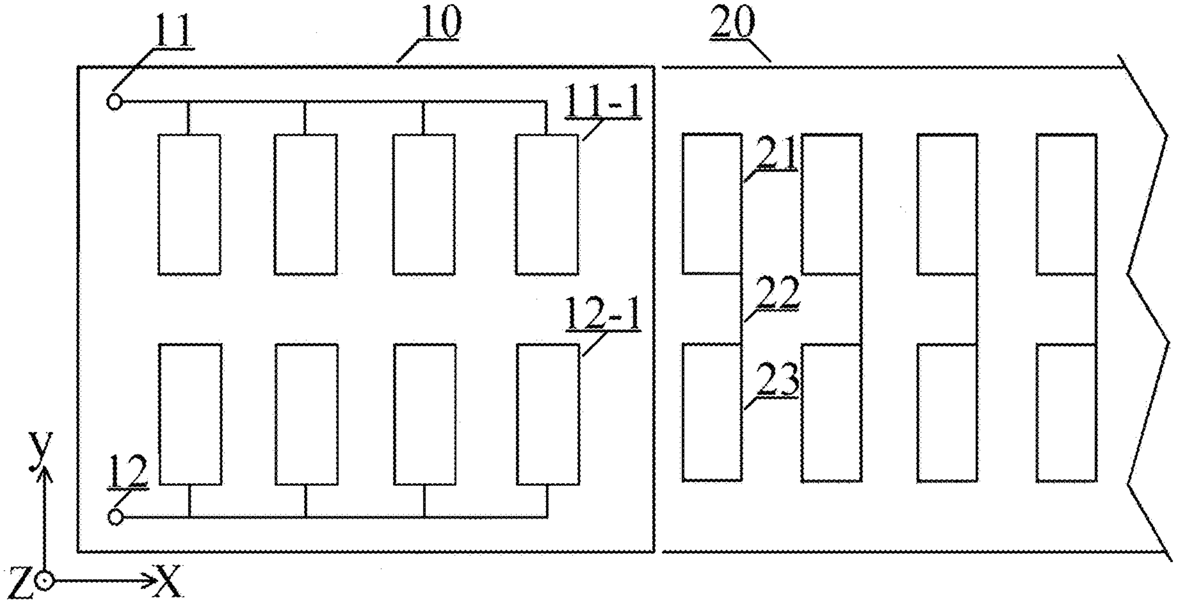

FIG. 6—shows a simplified overhead visualization of the sensor proposed in FIG. 5.

Figure 7:
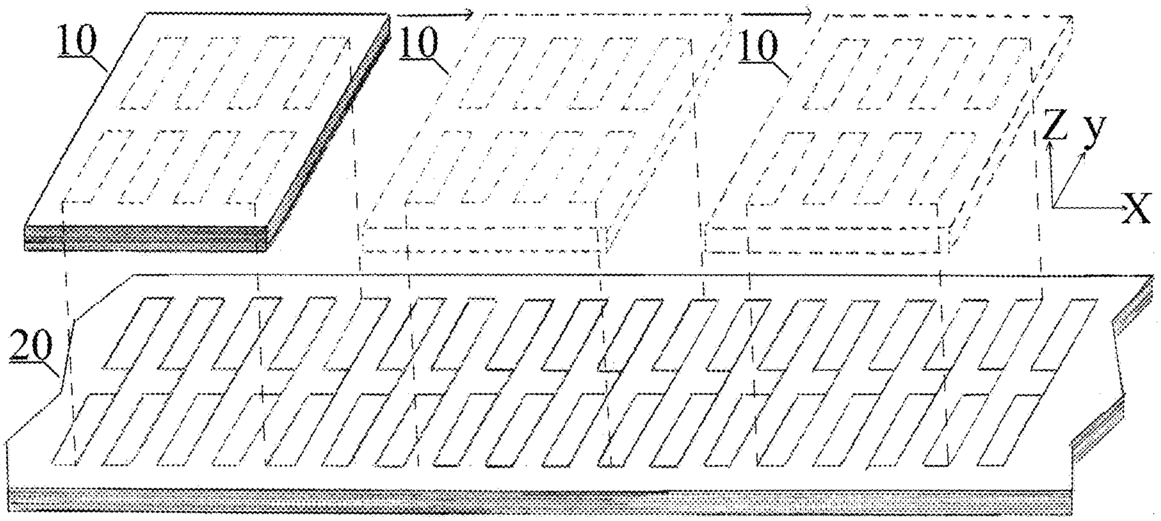

FIG. 7—shows a visualization of the slider's path of movement along the scale. In this example, the mechanically linear slider can move back and forth in the X-direction.

Figure 8:
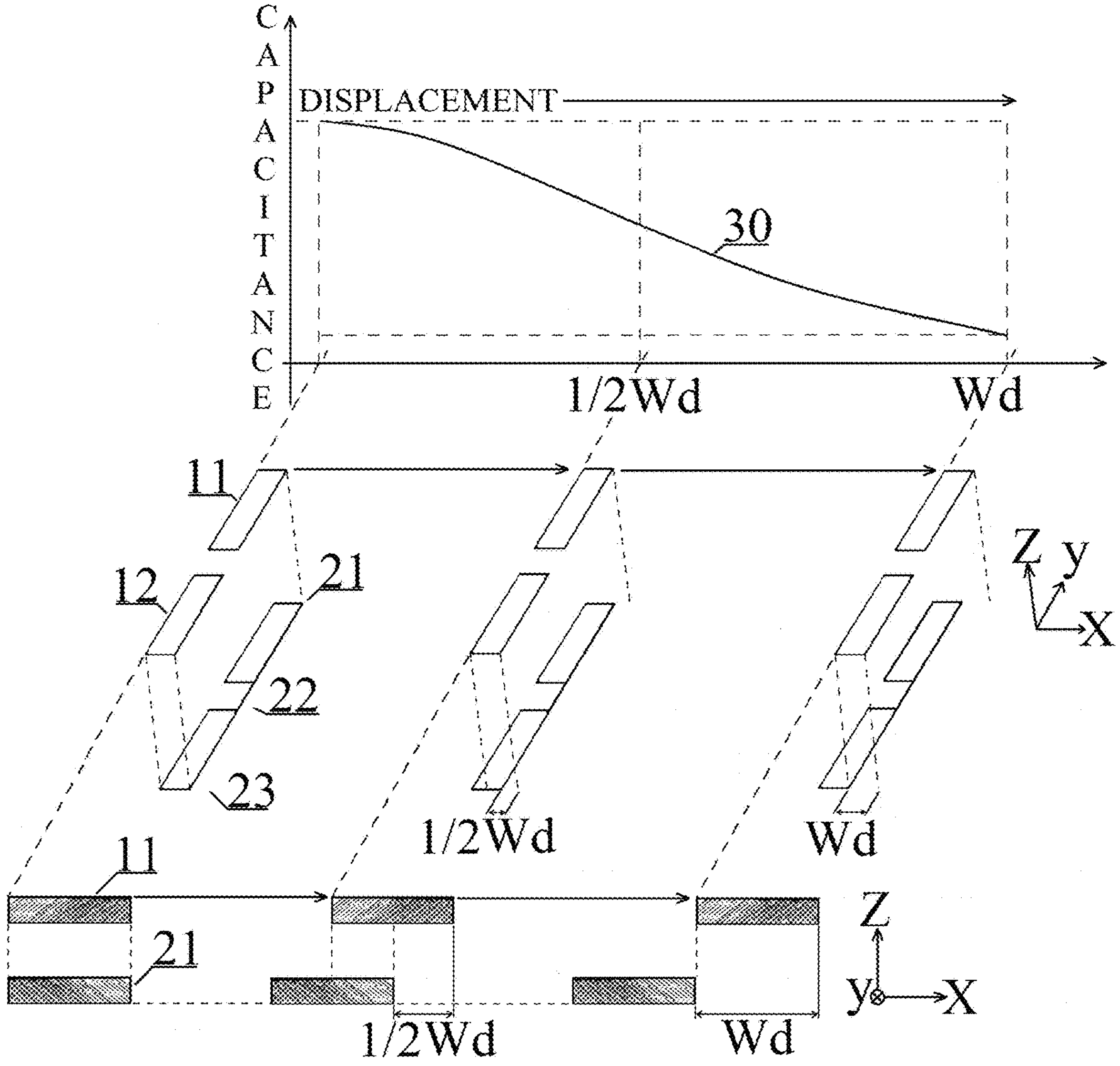

FIG. 8—shows a visualization of a nonlinear capacitive waveform (30), that would result from the pads moving past one another. (Wd) is a dimensional quantity, referring to the relative displacement between the slider and scale along the X axis.

Figure 9:
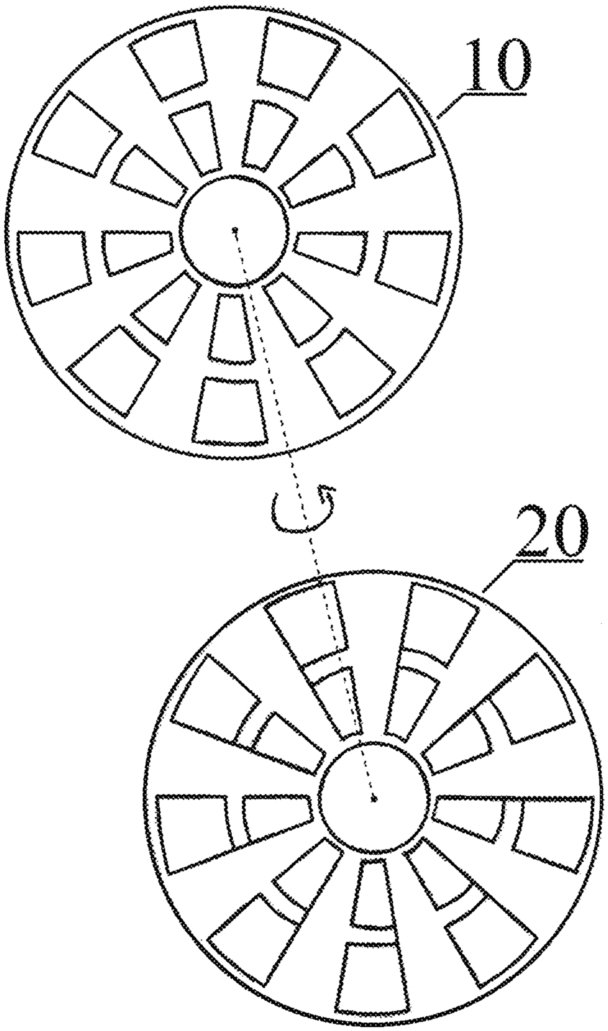

FIG. 9—shows a visualization of the slider's path of movement around a scale, in a radial case example.

Figure 10:
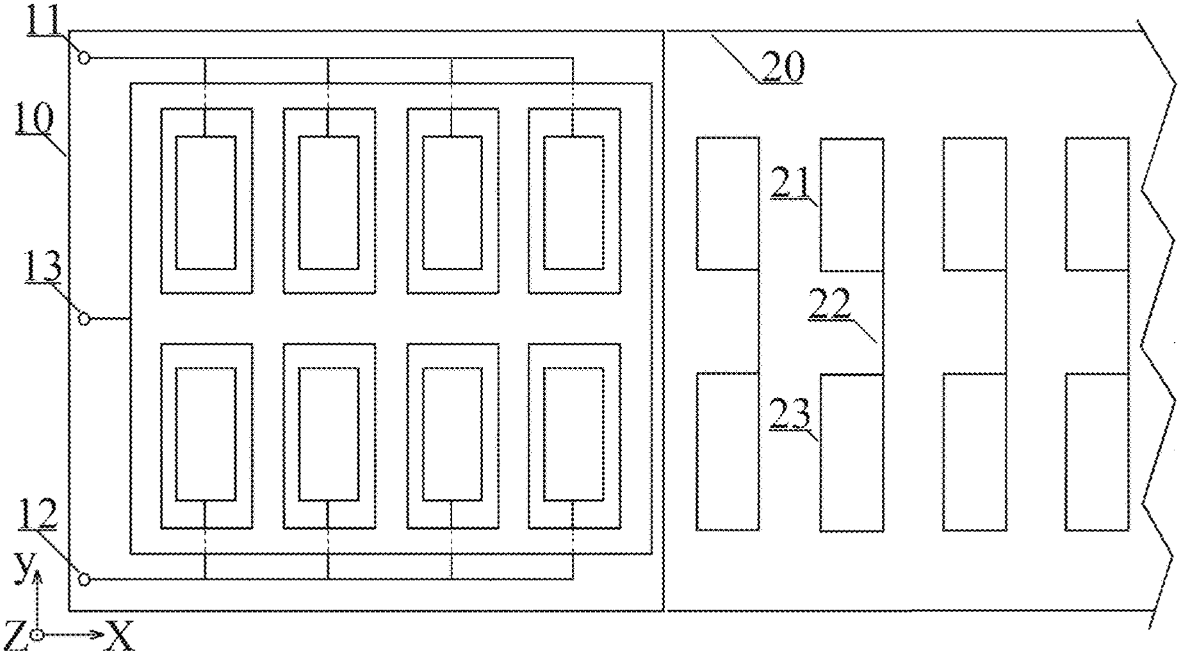

FIG. 10—shows a visualization of how a shielding, component (13), can be distributed around the slider's emitter and receiver pads.

Figure 11:
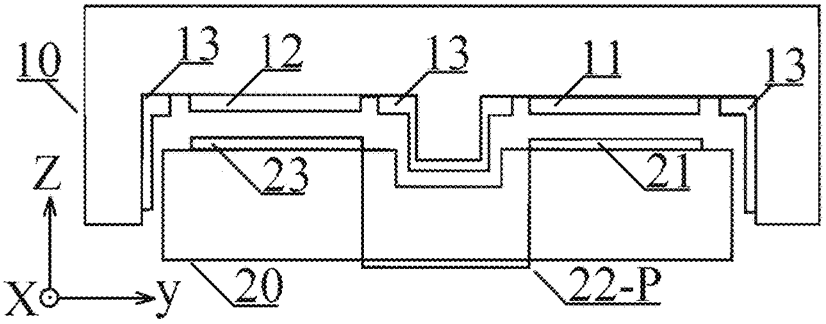

FIG. 11—shows a visualization of how the slider and scale could be notched to improve shielding. Component (22-P) is the variation of component (22) that involves the routing of a conductive connection to another side of the scale.

Figure 12:
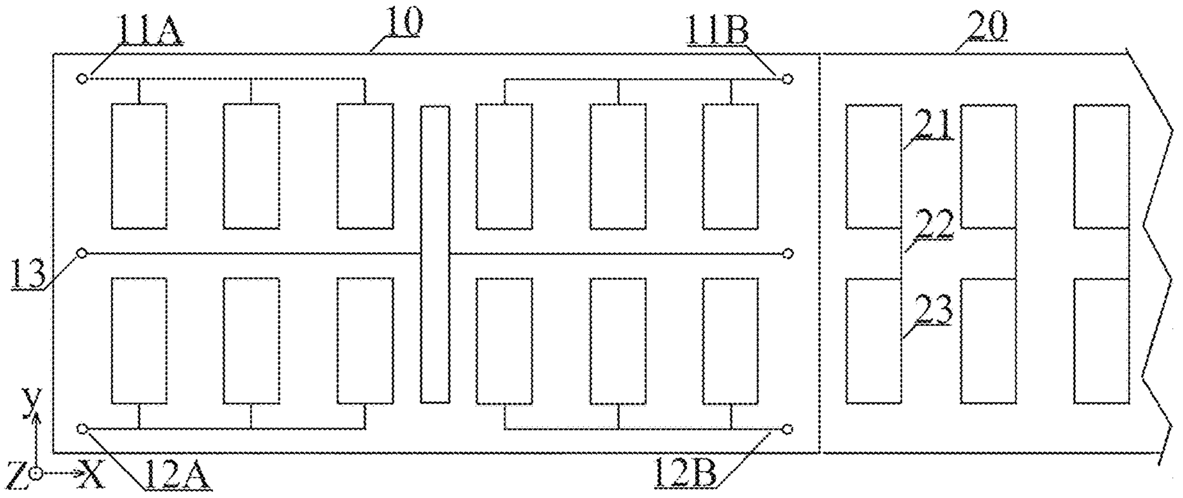

FIG. 12—is a top down view of how multiple groupings could be realized, with offset emitter and receiver groupings. Components (11A) and (12A) form an emitter—receiver grouping. Components (11B) and (12B) form another emitter—receiver grouping.

Figure 13:
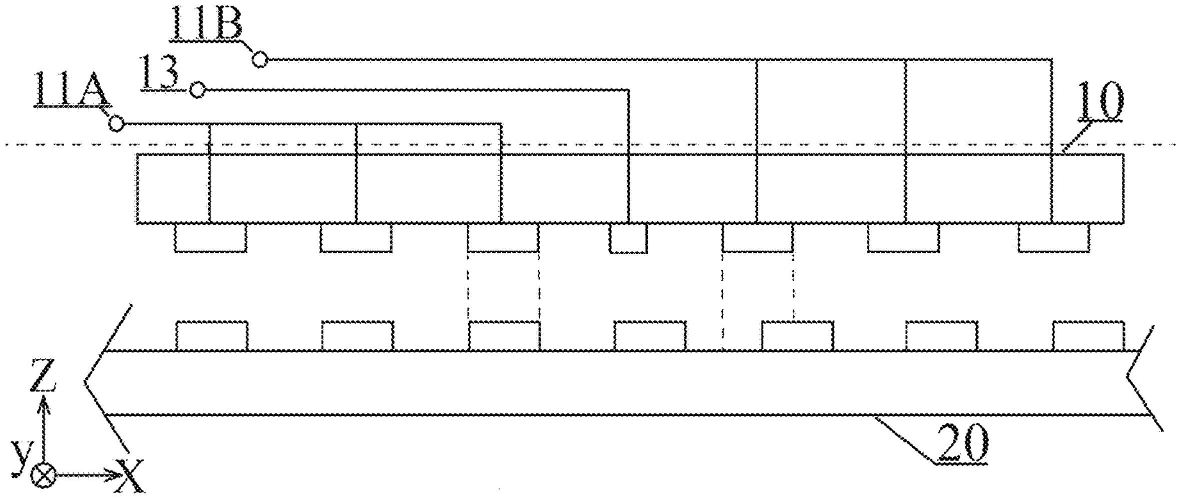

FIG. 13—is a cross-sectional side view of how multiple groupings could be realized. The horizontal dotted line represents the divide between the physical pad placement and the purely electrical routing of components (11A) through (13). The precise routing path(s) are not specifically relevant to the matter being explored by this figure. The vertical dotted lines show how the slider's groupings align with the scale's segments or pads.

Figure 14:
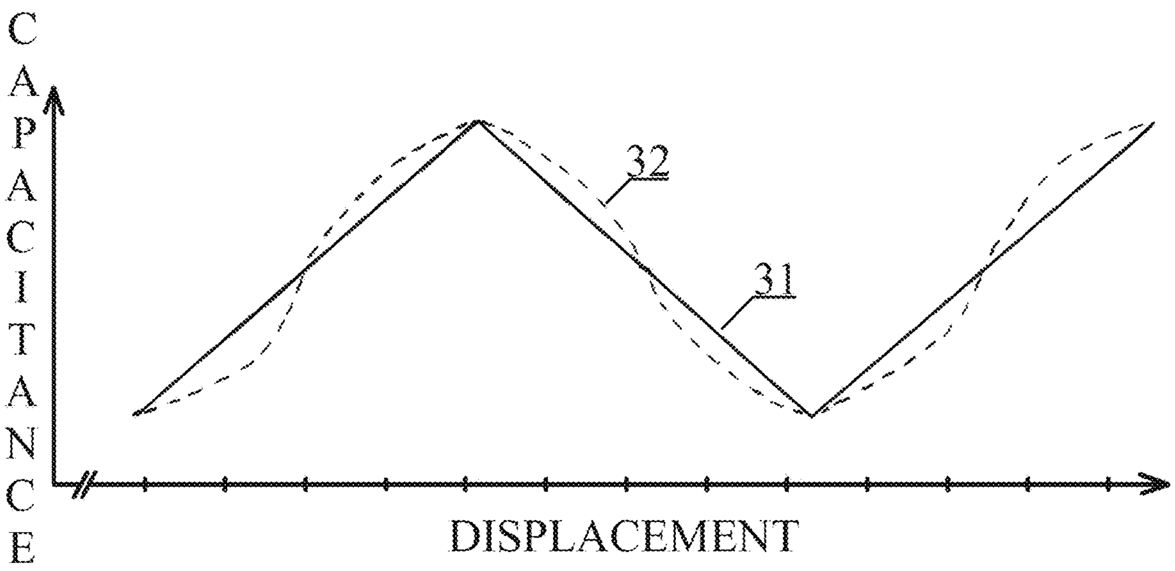

FIG. 14—is an exaggerated diagram to give a sense how fringing effects impact or deviate from the otherwise linear capacitive behavior. Waveform (31) represents an idealized, linear capacitive waveform. Waveform (32) represents a more realistic capacitive waveform when nonlinear fringing capacitive effects are taken into account. It is noteworthy in (32) that the slope changes along an interval.

Figure 15:
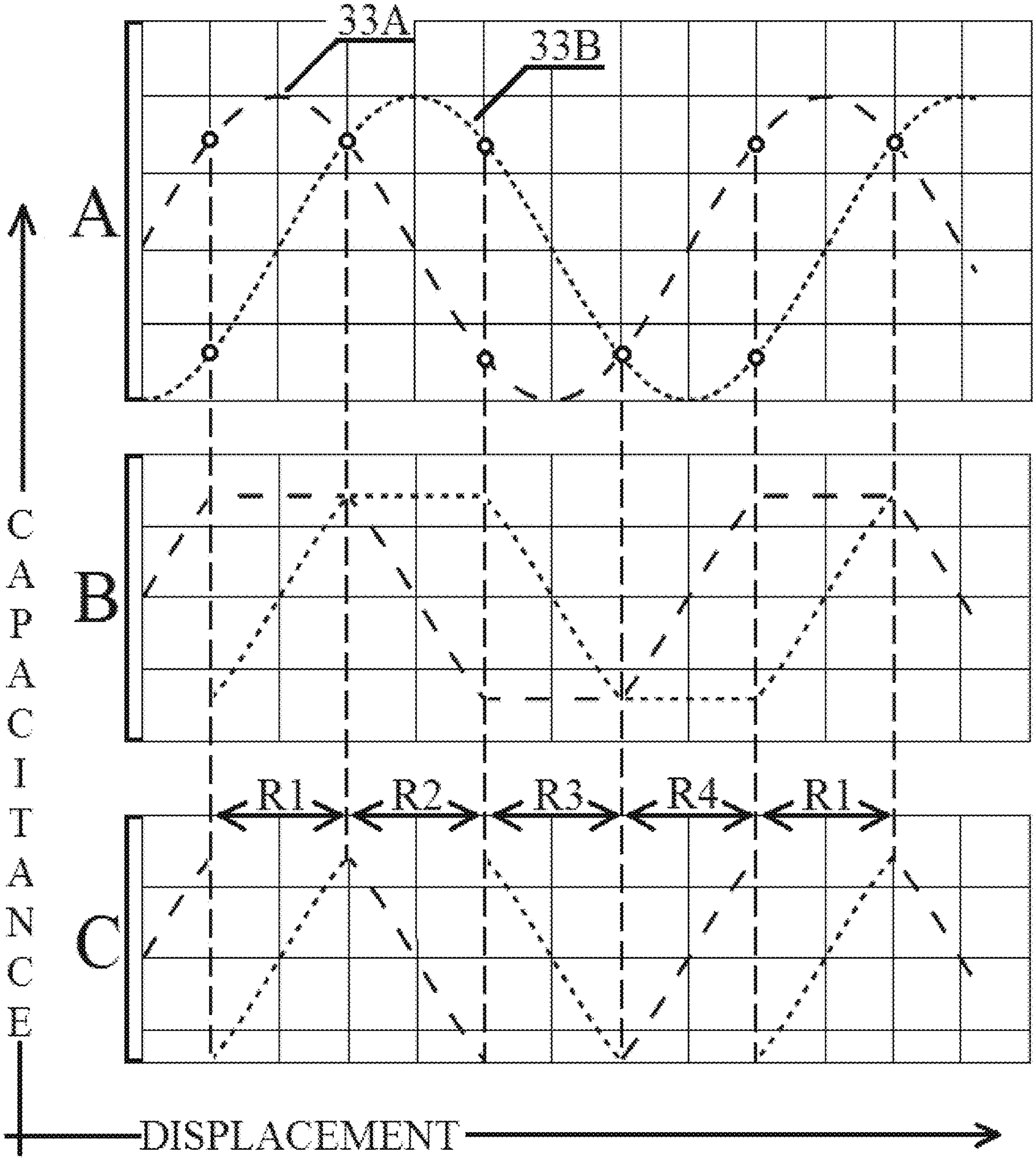

FIG. 15—is a waveform representation of multiple groupings. Dotted line (33A) represents the waveform associated with one grouping. Dotted line (33B) represents the waveform associated with another grouping. The two groupings are offset from one another by 90 degrees, or ½ the width of a pad. Plot (A), the top plot, represents possible waveforms from both groups. Plot (B), the middle plot, represents the waveforms when the sensor performs a scan and hold, switching at the vertical lines of intercept. Plot (C), the bottom plot, represents a possible waveform from both groups, when the sensor constructs one overall waveform from the two waveforms. (R1) represents the first region, (R2) the second region, (R3) the third region, (R4) the fourth region. The purpose of showing two (R1) regions is to illustrate the fact that the overall waveform is cyclical or repetitive.

Figure 16:
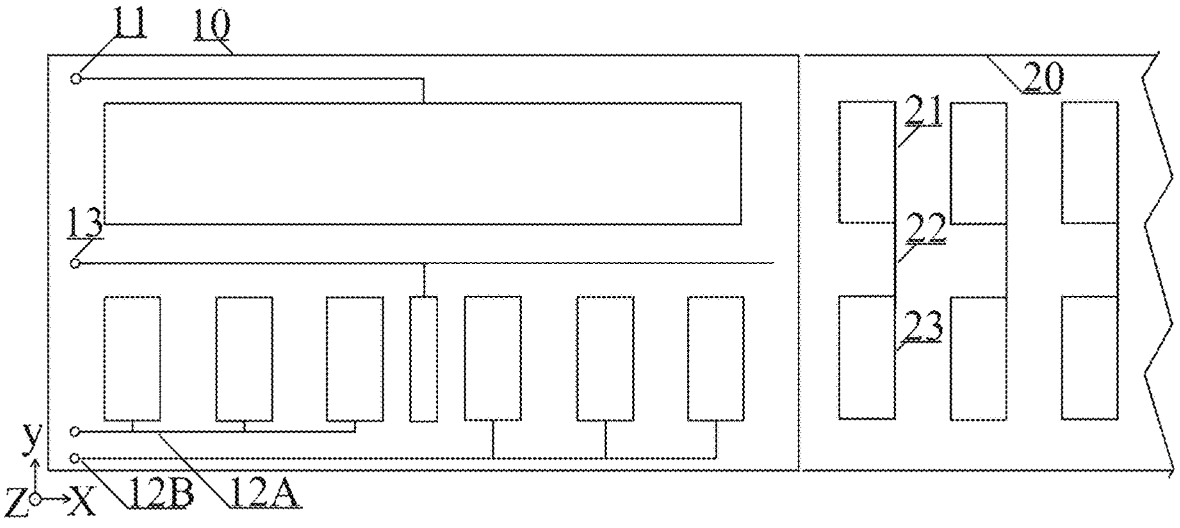

FIG. 16—is a top down view of how multiple groupings could be realized, with one large emitter and two offset receiver groupings. (12A) shows one receiver grouping, and (12B) shows another receiver grouping.

Figure 17:
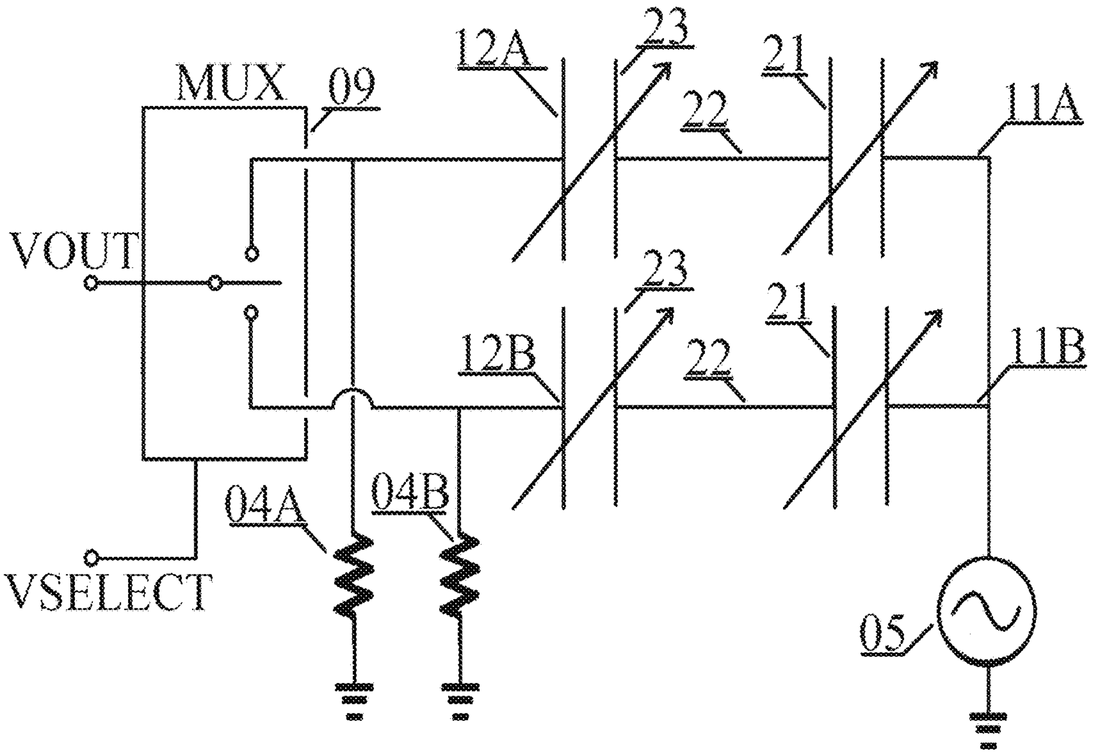

FIG. 17—is a simplified equivalent circuit diagram visualization of FIG. 16. (VSELECT) refers to the digital selection of the analog connection or pathway. (04A) represents one load impedance. (04B) represents another load impedance. Each load impedance is associated with a receiver grouping. (09) represents the switching element or circuitry for altering which grouping is connected to the rest of the Signal Conditioning Unit, component (06). In this case, the switching element is a MUX.

Figure 18:
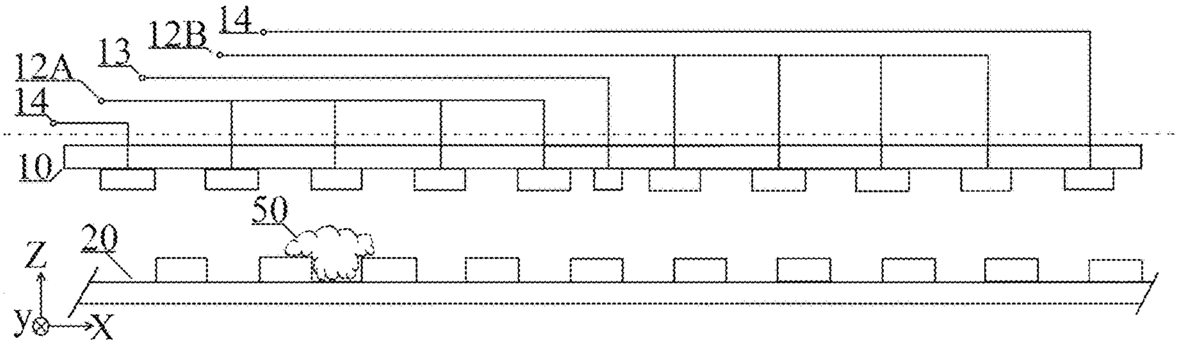

FIG. 18—shows a cross-sectional side view representation of the a prescanning sensor with a bit of debris, (50), on the scale. This is shown for the purpose of visualizing how the sensor could detect the debris, (50), in advance, and track it. In this depiction, the debris is in the region of group A. If the slider moves to the left, in the negative X direction, then the debris will end up in the region of group B. The horizontal dotted line represents the divide between the physical pad placement, and the purely electrical routing of components (12A) through (14). The precise routing path is not specifically relevant to the matter being explored by this figure.

Component (14) represents optional specialized pads in the form of prescanning pads.

Figure 19:
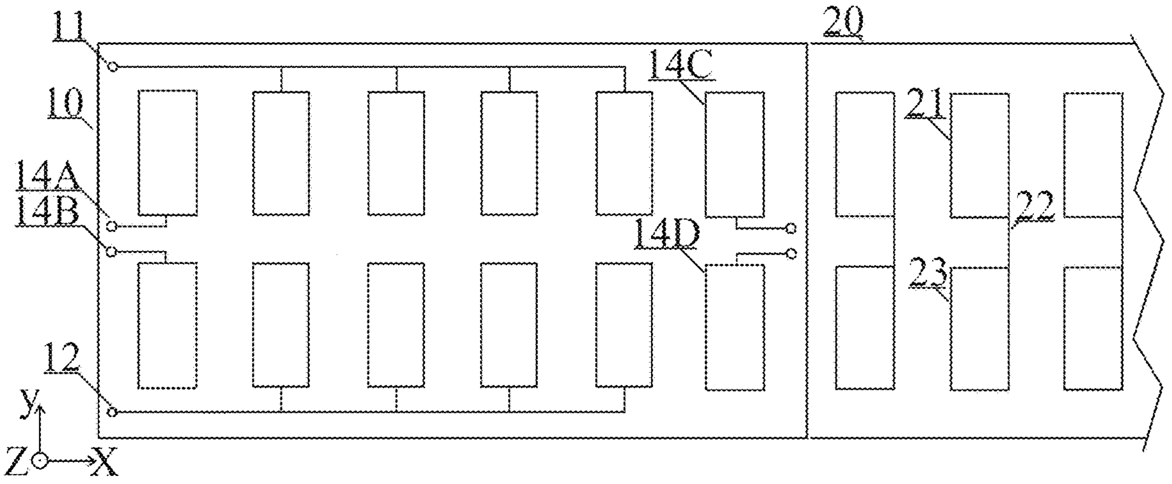

FIG. 19—shows a possible pad specialization, in particular, prescanning pads. The prescanning pads are represented by (14A), (14B), (14C) and (14D). In theory, either (14A) or (14B), (14C) or (14D) could be emitter or receiver pads, respectively.

Figure 20:
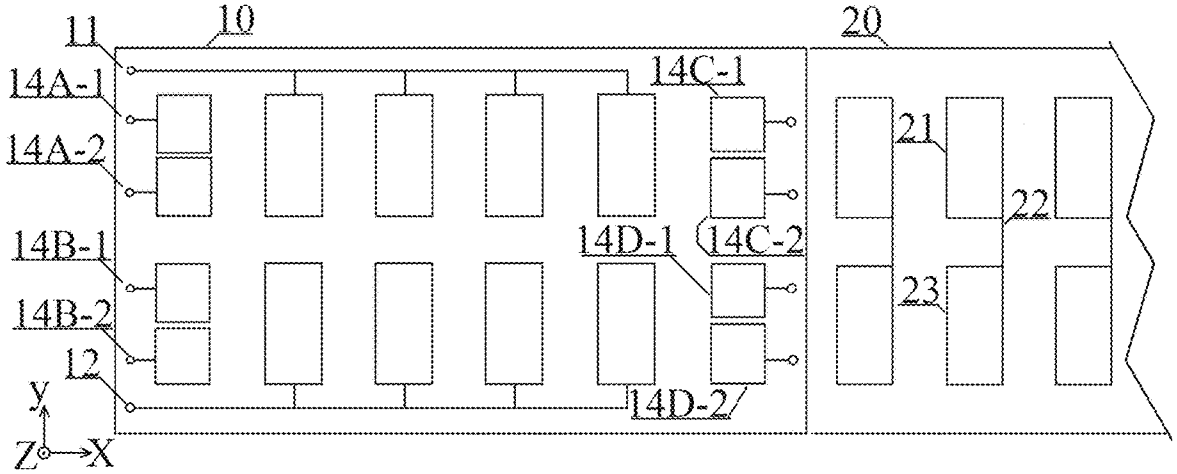

FIG. 20—shows another possible pad specialization approach, particular for prescanning pads designed for detecting certain misalignment errors. (14A-1) and (14A-2) are a specialized split form of (14A) prescanning pads. (14B-1) and (14B-2) are a specialized split form of (14B) prescanning pads. (14C-1) and (14C-2) are a specialized split form of (14C) prescanning pads. (14D-1) and (14D-2) are a specialized split form of (14D) prescanning pads.

Figure 21:
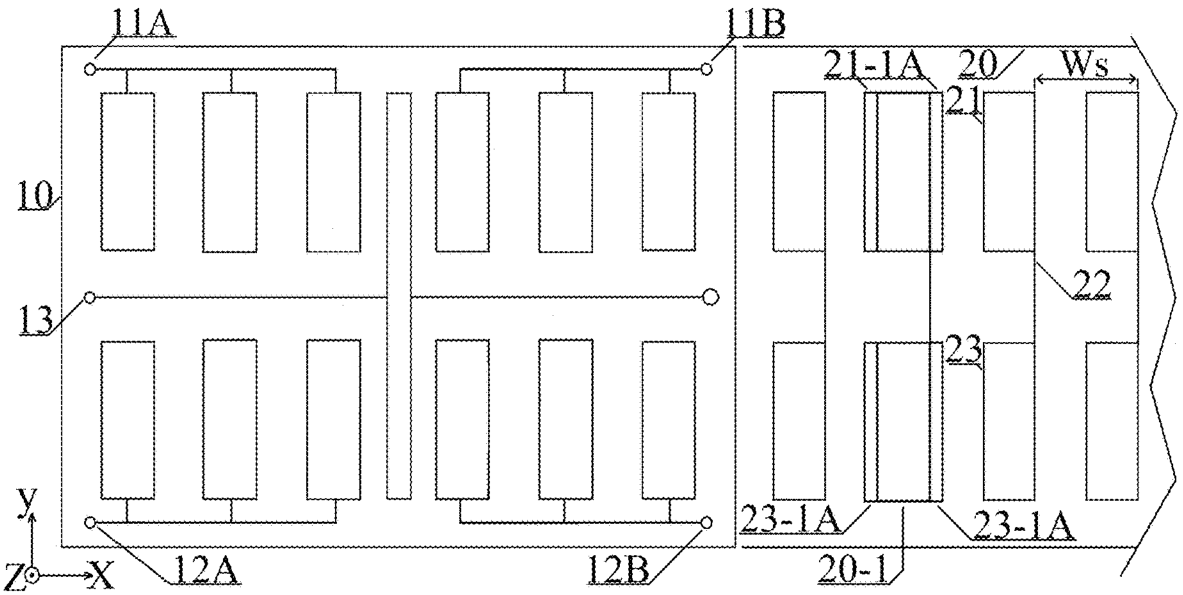

FIG. 21—shows a visualization of unique pad features, oversized scale pads, described by (21-1A) and (23-1A). This configuration could be used to provide absolute position information. (20-1) represents the center of the unique pad feature. (Ws) represent the spacing of the scale pads, which in this case is uniform.

Figure 22:
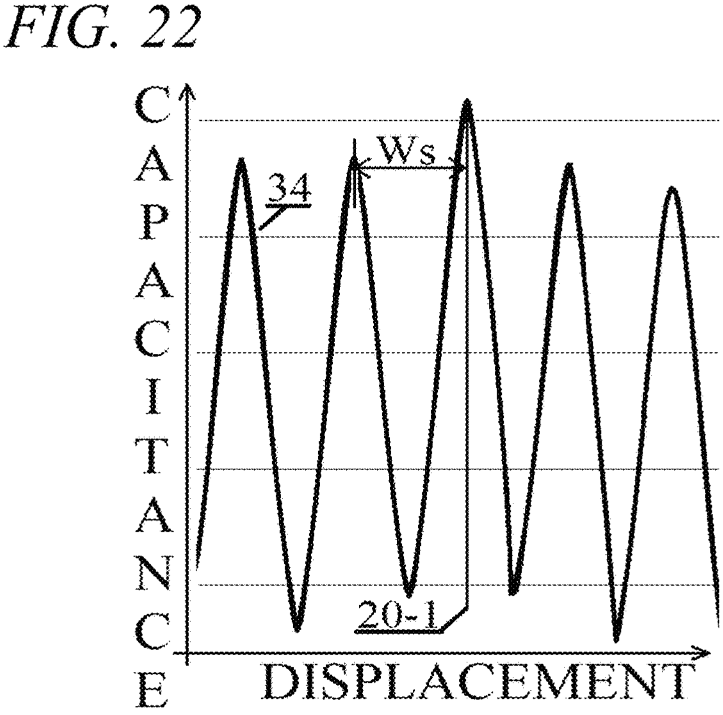

FIG. 22—shows a visualization of the capacitive waveform generated by the unique pad features described in FIG. 21. The waveform is denoted by waveform (34). (20-1) represents the center of the unique pad feature defined by (21-1A) and (23-1A). In this example, the middle peak in (34) occurs when the center of the unique pad (20-1) is centered with the slider's receiver pads, at a point of complete overlap. (Ws) represents the spacing of the scale pads in FIG. 21, showing up in the capacitive waveform's (34) periodicity FIG. 23—visualizes some of the many different configurations of components (21), (22) and (23), components of a scale pad. On the left, all three components are on the same plane. In the middle, (22-P1) is on a different plane than (21) and (23). On the right, (22-P2) is on a different plane than (21). (23-P2) may be on the same plane, or different plane as (22-P2), but is certainly on a different plane than (21).

Figure 24:
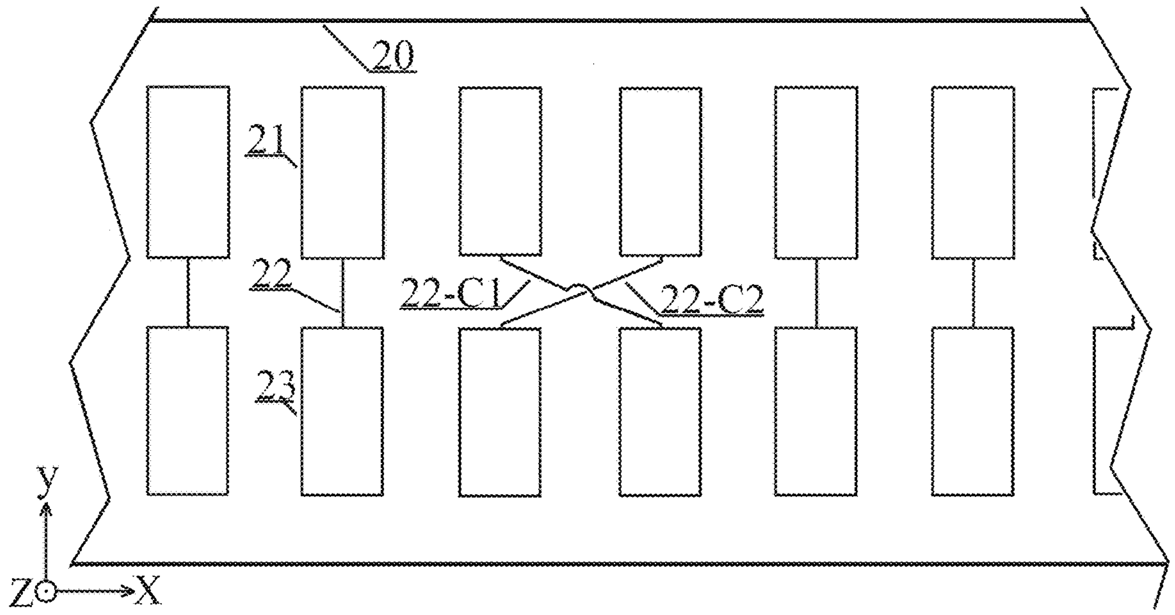

FIG. 24—visualizes the difference between a straight (22) connection and a possible crossed connection depicted by (22-C1) and (22-C2), in a top down view.

Figure 25:
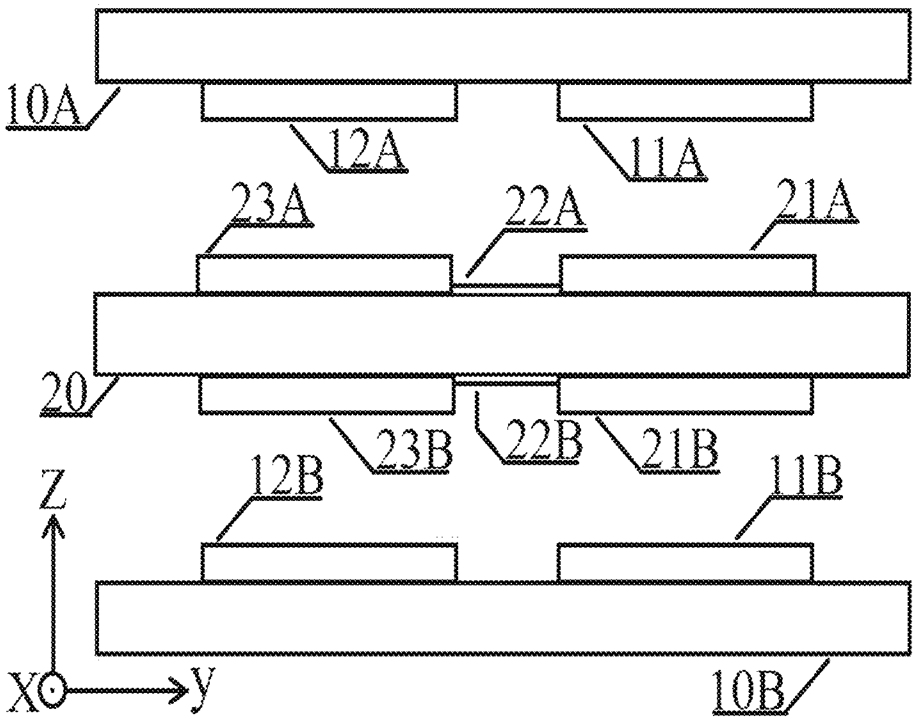

FIG. 25—visualizes a double layer sensor with two groupings, grouping A and grouping B. (10A) is slider side A. (11A), is the grouping A emitter. (12A) is the grouping A receiver. (21A), (22A) and (23A) are the components that make up a segment in the scale for side A, the side that couples with group A. (10B) is the slider side B. (11B) is the grouping B emitter. (12B) is the grouping B receiver. (21B), (22B) and (23B) are the components that make up a segment in the scale for side B, the side that couples with group B.

Figure 26:
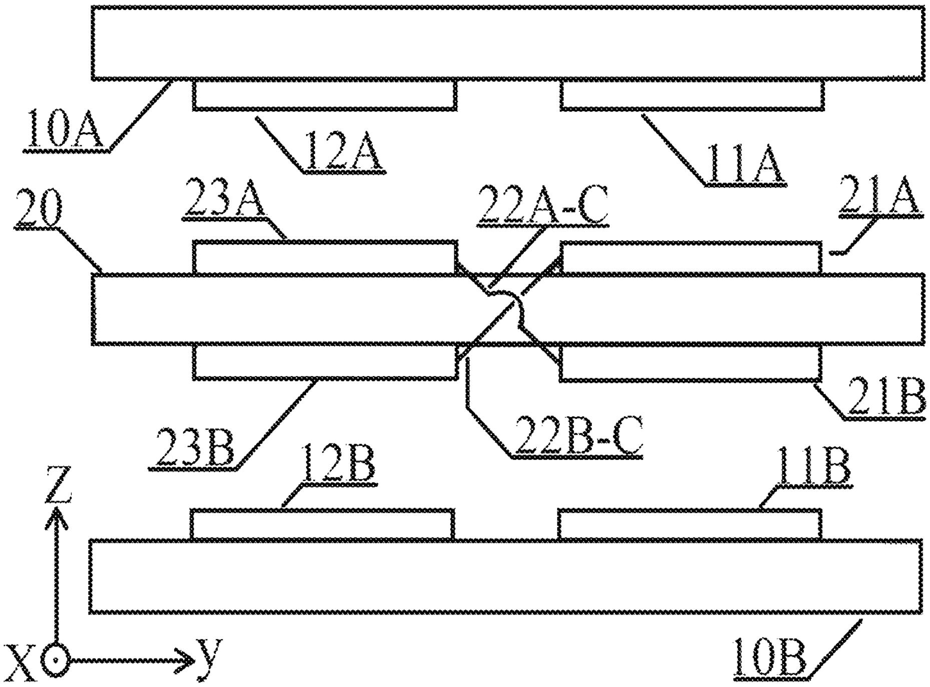

FIG. 26—visualizes a crossover for a double layer sensor with two groupings, grouping A and grouping B. (10A) is slider side A. (11A), is the grouping A emitter. (12A) is the grouping A receiver. (21A) and (23A) are the components that make up a segment in the scale for side A, the side that normally couples with group A. (22A-C) is a crossover connection between layers, from the bottom side (21B) to the top side (23A). (10B) is slider side B. (11B) is the grouping B emitter. (12B) is the grouping B receiver. (21B) and (23B) are the components that make up a segment in the scale for side B, the side that normally couples with group B. (22B-C) is a crossover connection between layers, from the top side (21A) to the bottom side (23B).

Figure 27:
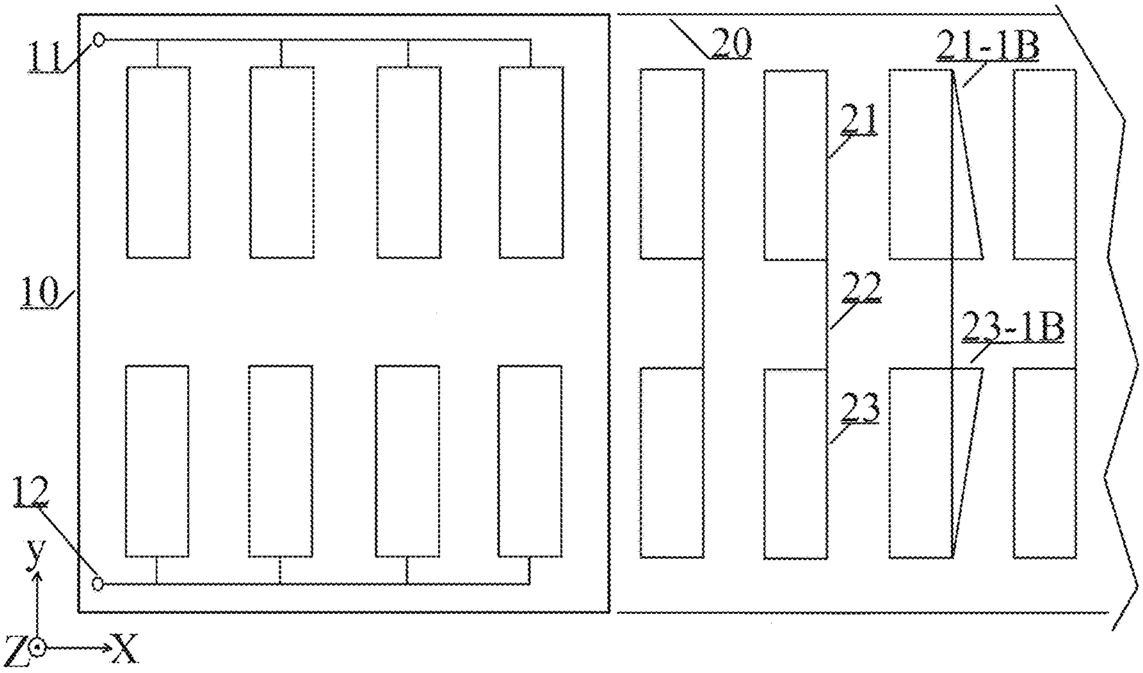

FIG. 27—is a visualization of an asymmetric intentional irregularity on the scale, characterized by a trapezoidal pad shape, components (21-1B) and (23-1B).

Figure 28:
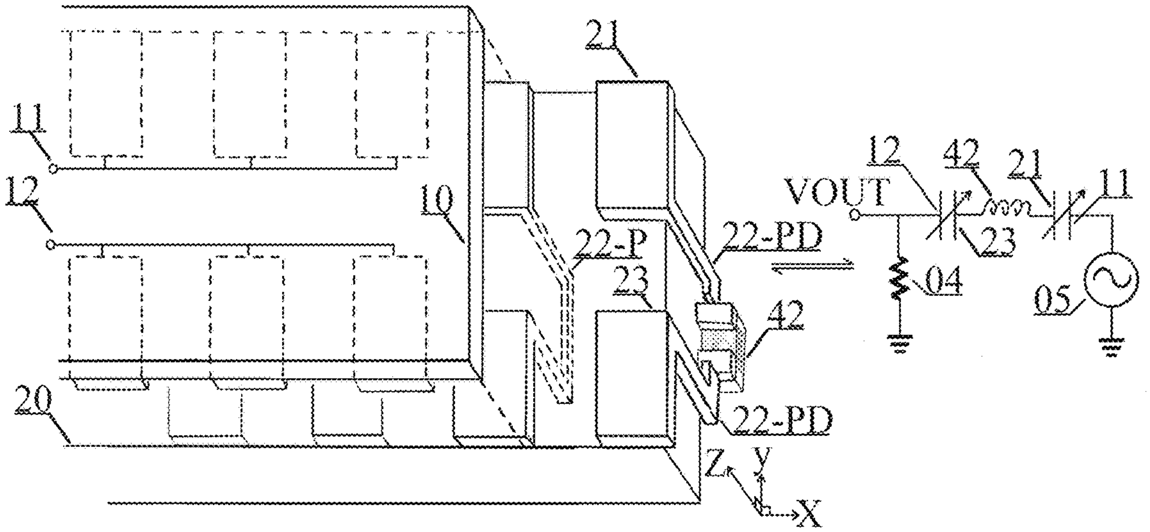

FIG. 28—shows a visualization of embedded components on the scale vs no embedded components, depicted by the two different cases: (22-P) vs (22-PD). (22-P) represents case where the scale conductive connection goes to the other side of the scale, but does not have an associated discrete or embedded component. (22-PD) represents a case where the scale conductive connection goes to the other side of the scale, and does have a discrete or embedded component. It doesn't necessarily matter where the component is embedded, but on the other side of the scale seems convenient. The embedded or discrete component is visualized as (42). In this case, the left shows a simplified isometric view and the right shows a simplified circuit diagram, where component (42) is an inductor. However component (42) could be any embedded component or components, it does not have to be an inductor.

THE BASICS OF ENABLEMENT—COMPONENTS OF CAPACITIVE ENCODERS

For the present invention to be enabled, it needs to be clear how a capacitive encoder can be made. The following outlines basic components and elements in the construction and operation of capacitive sensors. These basics focus on an Amplitude Modulation based capacitive encoder design. However, it should be well understood by someone skilled in the art that this basic template generalizes to other approaches; approaches such as phase modulation, frequency modulation, etc. Some or many of these components should be well known to someone skilled in the art. In particular, construction, fabrication and other mechanical details are not expected to vary greatly from prior art. This patent does propose changes to some of the electrical and conductive components to achieve the proposed effects. These changes are detailed in their respective embodiments. These changes can be seen as modifications to the following basic outline.

Basic Shape and Layout

A visualization of a capacitive encoder can be seen in FIG. 10. This can be seen as the template model that the embodiments build on, with a slider (10) and scale (20). An equivalent circuit diagram can be seen summarized in FIG. 11. These components, slider and scale, contain conductive pads. Pads (11) and (12) are emitter and receiver pads, respectively. These parts are located on the slider component (10). Components (21), (22) and (23) comprise aspects of one complete scale pad. Components (11) and (21) capacitively couple together. Component (22) provides a conductive conduit for a signal to travel from (21) to (23). Components (23) and (12) capacitively couple together.

The scale typically contains many smaller pads, not connected together conductively. The slider typically contains many smaller pads, some of which may be connected together conductively. The rectangles (11-1) that make up (11) are shown connected together conductively, typically by circuit board traces. The rectangles (12-1) that make up (12) are shown connected together conductively, typically by circuit board traces. Other shapes and configurations are possible. For instance, it is possible for either the emitter or receiver pads to be one large pad instead of many narrow pads. However, to have one large pad for the emitter and one large pad for the receiver in the same design is generally not desirable.

Constituent circuitry for components (05), (06), (07) and (08) is not shown for simplicity. Like many prior art, it should be well understood that such components would be located on or integrated into the slider.

Basic Construction and Materials

Capacitive encoders are usually constructed with traditional materials, like printed circuit board (PCB). PCB's are heterogeneous in nature, with conductive components (pads, traces, etc) and non-conductive aspect holding it all together (substrate). However, a similar effect can be achieved with other construction techniques. For instance, lithography.

The mechanical components are not expected to vary greatly from existing prior art. The fabrication and construction is not expected to vary greatly from existing prior art.

Basic Components or Modules

Capacitive position sensors almost universally contain the same basic modules and perform the same basic operations regardless of type. These common elements are summarized as follows:

1. Capacitive Circuitry Module, being comprised of:
Capacitive Circuitry Unit
2. Measurement Module, being comprised of:
Signal Generator Unit
Signal Conditioning Unit
Demodulation Unit
3. Interpreting Module, being comprised of:
Processing unit where the function of these modules can be generalized as follows:

1. Capacitive circuitry Module: this module creates the capacitive property being measured. For most sensors this amounts to a variation in capacitive coupling.

2. Measurement Module: this module is what interacts with and extracts measurements from the capacitive circuitry being measured.

3. Interpreting Module: this module is what makes sense of the collected data, correlating the measurements with the respective position information, and these components are consistent with FIG. 11 and FIG. 12.

For an Amplitude modulation Encoder, these modules could have the following configuration:

1. Signal Generator Unit

The Signal Generator, component (05), operates by energizing (11) with a high frequency signal. It is connected to the emitter pads as seen in FIG. 11 and FIG. 12. This signal could be any alternating, or pulsing signal, but would generally and conveniently be a square wave between 10 KHz-1 GHz; a square wave can be easily generated by a pulse width modulator (PWM) component found in many microcontrollers. Other signal generating methods or components are also possible.

2. Capacitive Circuitry Unit

The capacitive circuitry in this sensor can be seen as components (11) to (21), (22) and (23) to (12), as illustrated in FIG. 11 and FIG. 12.

Components (11) and (12) comprise the slider as emitter and receiver, respectively. Components (21), (22) and (23) are what comprise a pad on the scale. In this sensor, operation is simple. The slider moves along the scale. The overlap between the slider and scale pads change as the position of the slider changes. The amount of overlap changes the amplitude of the capacitance.

The nature of the scale pads is important. Some prior art rely on a wired connection between the slider and the scale. For most practical application, the sensor should be wireless. Wireless coupling is enabled by having components (21), (22) and (23). This way, the signal emitted from (11) travels to (21) by the capacitive coupling between them. The signal travels from (21) through the conductive channel (22) to (23). At (23), the signal can travel back to the slider by capacitive coupling between (23) and (12).

The emitter pads can all be connected electrically parallel. If this is done, only a single signal generator is needed. The receiver pads can all be connected electrically in parallel. If this is done, only a single signal receiver circuit is needed.

The receiver-emitter layout can be shielded. One example of shielding can be seen in FIG. 17. Component (13) represents a possible shield electrode placement. The level of shielding is based on manufacturing techniques available and the desired complexity of the sensor. The shielding can be passive, or active. More advanced shielding arrangements are also possible, like the indented shielding seen in FIG. 18. Component (13) provides shielding in this case. It is also possible to implement differential techniques, like those discussed in prior art.

These slider and scale pad elements need to function in such a way as to vary the amplitude of the capacitance as the slider moves along the scale. In order to do that, the pads are spaced apart so that overlap can change. This can be seen in how the slider pads line up with the scale pads in FIG. 12 and in FIG. 15, where pads are shown to slide past one another.

In theory, the emitter could be one solid pad, or many individual pads in parallel. The greater the number of individual pads, the greater the number of distinct increments. The number of individual emitter pads could be optimized. The size of each pad, as well as their spacing can also be optimized. If half as many pads are chosen, then each pad may be twice as large. A similar principle is also possible with the receiver pads.

3. Signal Conditioning Unit

The received signal should be preprocessed using a Signal Conditioning Unit, component (06), as seen in FIG. 12. This unit may perform any number of tasks. Tasks may include one or more of the following: impedance matching stage(s), variable load impedance stage(s), high impedance input amplifier stage(s), differential common mode noise rejection stage(s), center frequency tunable band pass filter stage(s) and noise rejection stage(s). Not all of the components listed above have to be used, nor do they have to be in the order listed above. The order listed above gives a feel for how these components could be arranged, one feeding the next, feeding the next, and so on. Adjustable components, like the variable load or tunable filter, can be set with outputs from the Processing Unit (08). Other methods of tuning and or setting these adjustable components are also possible.

Note: A high impedance input amplifier is ideal for buffering the input signal with negligible impact on the effective impedance or overall input impedance seen by the signal at (12) when looking into the receiving circuitry. The receiving circuitry can be seen as the Signal Conditioning Unit and the Demodulation Unit.

Many low cost, off the shelf micro-controllers come with built-in differential and high impedance amplifiers.

One example is Cypress's PSOC 4 series chips.

The implementation of a differential stage should be well understood by someone skilled in the art of electronics and capacitive position sensors. The operation and implementation of filter stage(s) should be obvious to someone already skilled in the art of electronics. Impedance matching is well known in the field of transmission theory.

A load impedance can be used to reduce signal reflections and improve the signal to noise ratio. This is done by impedance matching. However, it may be desirable to have an adjustable load impedance for other purposes.

To make the load impedance adjustable, the magnitude and or electrical characteristics should be adjustable. This can be achieve by constructing the variable load out of discrete parts, like resistors, inductors and capacitors. These components can be in parallel and or series configurations. By adjusting the connection and configuration of the discrete parts with the appropriate switching circuitry, the load impedance becomes adjustable. Other components can be used instead, like a discrete, digitally controlled variable resistor.

Regardless of how the load impedance is made variable, the key element here is that it is adjustable.

What use is variable load impedance?

A variable load impedance is part of the receiving circuitry. Varying the load impedance can change input impedance of the receiving circuitry. Changing the input impedance of the receiving circuitry can change the amplitude of the received signal. This change can be modeled according to the following equation:

$$Vout = Vin \cdot \left( \frac{Zload}{Zload + Zcapacitor} \right)$$

where Vout is the received signal where Vin is the emitted signal where Zload is the receiving circuitry input impedance, being comprised by the variable load impedance and the impedance of the rest of the receiving circuitry where Zcapacitor is the impedance of the capacitive circuitry defined by (11) to (12).

The receiving circuitry will have a finite range of operation. Within this range of operation will exist a range of optimal function. If Vout has a potential amplitude range wider than the range that can be normally or optimally supported by the receiving circuitry, then it is useful to use the load impedance to adjust the amplitude accordingly.

Given an adjustment to the variable load impedance, how will Zcapacitor be calculated?

It is a simple matter to determine the capacitive impedance (Zcapacitor) despite adjustments in the variable load impedance, as described in the following equation:

$$Zcapacitor = \left( \frac{Vout}{Vin} + 1 \right) \cdot Zload$$

where Vout is measured where Vin is known where Zload is set by adjusting the variable load impedance where Zcapacitor is calculated.

Calculations such as these can be performed in the Processing Unit.

4. Demodulation Unit

The preprocessed signal should be fed into a Demodulation Unit, component (07) as seen in FIG. 12, to extract the envelope. This may be achieved through any reasonable method such as but not limited to demodulation circuitry, analog and or digital (hardware), and or digital demodulation signal processing (software).

This stage should contain the analog to digital conversion system, likely an ADC. If the demodulation occurs in hardware, the ADC should come after the demodulation circuitry.

5. Processing Unit

The demodulated signal, the envelope relates to displacement. The relationship can be visualized by waveform (30) in FIG. 15. (Wd) is a dimensional quantity, referring to the relative displacement of the slider along the X axis relative to the scale. The envelope or received signal intensity correlates to the circuit impedance. Knowing the intensity of the emitted signal and the intensity of the received signal, relative displacement within an interval can be calculated through the correlation between capacitance and relative position. The correlation can be captured with equations, transfer function(s), lookup tables or other methods.

These calculations are done in the Processing Unit, component (08). The Processing Unit is likely a microcontroller, but could be implemented using any other reasonable processing circuitry or system.

The Processing Unit can also be used to control or set any features in the Signal Conditioning Unit that are adjustable as necessary or desired.

The number of peaks and valleys, or whole intervals traversed can be tracked by the Processing Unit (08) to compile an accurate view of the overall displacement.

To increase performance, a history of one or more past or recent measurements can be retained in memory. This way, the next or current measurement can be compared against a series of one or more previous measurements. This also allows the decoding of speed and acceleration from displacement. Speed can be evaluated or approximated by taking the derivative between different displacement measurements. Acceleration is likewise the second order derivative. Consistency can be evaluated using a number of metrics. For instance, the acceleration or velocity data can be used ensure points of discontinuity are caught. The next or current reading can also be compared to previous readings to determine consistency. If the measurements are inconsistent, for example one does not follow the others within some boundary of expectation, then by virtue the sensor has detected atypical situations such as but not limited to, fault conditions.

There are many ways of determining consistency. For instance, the next position measurement should be reasonably consistent with previous position measurements, speed and acceleration measurement(s) or approximations. For instance, using the last known position, the time interval between samples, and the velocity, it is possible to estimate the next position. If the next position measurement and the estimated position measurement do not agree closely, then a fault has likely occurred. The next measurement should also follow along the capacitive waveform. If it does not, then that is another fault situation.

It should be well understood that principles in amplitude modulation can be generalized for other sensor types, like phase or frequency modulation capacitive sensors.

For discussion purposes, the embodiments explore their respective ideas using this basic sensor as a template.

However, the ideas themselves are not dependent on the amplitude modulation sensor previously described.

The embodiments include:

EMBODIMENT 1: Multiple Groupings

EMBODIMENT 2: Pad Specialization

EMBODIMENT 3: Absolute Positioning

EMBODIMENT 4: Embedded Components

The embodiments and their concepts can be combined in any reasonable combination of one or more.

EMBODIMENT 1

(Multiple Groupings)

To enhance sensor performance, an encoder could have more than one grouping. Pad groupings could be like the offset sensing electrodes seen in FIG. 12 (a top view) and FIG. 13 (a side view). Groupings (11A), (12A) are offset from (11B) and (12B). They are separate and not intermixed. The purpose here can be multi-factorial. For instance, as seen in FIG. 14, the slope of (31) is uniform across an interval. However, this is not realistic. Waveform (32) is more realistic, visualizing how the waveform's slope can change over an interval. The sensor is less accurate in the regions where the slope is less. In this case, the sensor is least accurate in the region of the peaks and valleys. It is simple enough to offset two, or perhaps more, different sets of receivers, or emitters, or receivers and emitters for the purpose of selecting the set that provides the highest degree of resolution at any given point in time or space of the sensor's operation. An example of this can be seen in FIG. 15. Other benefits also exist.

First and foremost: What is a grouping?

A grouping is a collection of one or more pads in the capacitive circuitry module necessary to obtain or create a measurement. An emitter grouping is one complete unit of emitter pads able to perform emitter functionality by itself and enable the sensor to obtain measurements without the functionality of any other emitter or emitter groupings. A receiver grouping is one complete unit of receiver pads able to perform receiver functionality by itself and enable the sensor to obtain measurements without the functionality of any other receiver or receiver groupings. An emitter and receiver grouping is one complete unit of emitter and receiver pads able to perform emitter and receiver functionality, respectively. An emitter and receiver grouping is able to obtain a measurement without the functionality of any other emitter(s), receiver(s) and or grouping(s).

If a grouping has two or more pads, they are located physically together and not intermixed with the pad(s) of another grouping. Given two groups each with two pads, group A and group B, group A pads could be arranged A-A, and group B pads could be arranged B-B, where 'B' defines one electrode and B-B defines two side by side electrodes. Mixing would be defined as something along the lines of A-B-A-B. In short, a grouping's pad(s) are distinct and separate from the pad(s) of another group.

Note: Emitter electrodes can be said to be driven. To drive or energize means to apply signal(s) necessary to perform measurements of or using the capacitive circuitry module. Such signal(s) may be high frequency in nature, from a Signal Generator like component (05). Signals used to help obtain a measurement from the capacitive circuitry module will be of the type appropriate for the sensing technique being used. For instance, amplitude modulation may involve a single high frequency signal. Phase modulation may involve multiple high frequency signals that differ in phase. IDAC capacitive sensing may involve a current source signal. And so forth.

Groupings will have a clear distinction from one another. For starters they must not be mixed. Additional distinction can be manifested through physical spacing, separation, offset and or isolation. This will help reduce inter-group crosstalk, signals from one group contaminating another group.

It may be desirable to increase the isolation between groups more than is achieved through offset. Achieving isolation can be done through methods of electrical separation and or time slotting. Electrical separation may involve orthogonality or shielding and is discussed in the next section.

For ease of discussion, the focus will be mainly on the restrained case of offset groups of receivers. It is implied that the concepts discussed for this one case can be generalized to other cases, like phase modulation, frequency modulation, etc.

Discussion on Groupings

FIG. 12 shows emitters and receivers grouped into sets that are physically offset. In this example, all (12A) pads are together to form Group A. All (12B) pads are together to form Group B. In this case, Group B is spatially offset from group A by 90 degrees, or half the width of a scale pad. This will result in the repeating waveform from group B's measurements to lead or lag the repeating waveform from group A's measurements by 90 degrees. Half of a period of a waveform is visualized in FIG. 8, by waveform (30). The half not shown is symmetrical to the half that is shown. If desired to increase isolation between groupings, the groupings can be placed a distance apart from one another. Physical space or offset between groupings will help prevent cross-talk. However, it may be more desirable to place shielding pad(s) or shielding electrode(s) between groupings instead. The shielding electrode(s) can be of any appropriate size. It may be desirable to optimize their size, particularly their width. This optimization is to balance bulk (size) to performance in relation to the offset interval desired. Shielding will help reduce and or prevent crosstalk and noise.

There are also other methods to help reduce crosstalk. In particular, for each group with a respective emitter, each emitter and or emitter receiver group pair can be driven or energized with different signal(s) from the Signal Generator, component (05). It may be desirable for some or all signals to be orthogonal to one another. In particular, it may be desirable for signals on adjacent or nearby groupings to be orthogonal in nature. Signals can be orthogonal in time and or frequency.

Examples of shielding between groupings can be seen in FIG. 12, FIG. 13 and FIG. 16. The barrier or shielding is component (13). If desired, each grouping's orthogonal signal can be isolated from one another on the receiving end by the Signal Conditioning Unit, component (06). This isolation separation is particularly true with emitter receiver pairs. The receiving circuitry can be adjusted for each group in such a way as to accept or filter only for the signal associated with that group when taking measurements from that group. A number of separation or filter methods are possible and their implementation should be obvious to anyone already skilled in the art of electronic communications.

Isolation can also be improved by time slotting the sensor's operations. The pads could effectively pass a time window back and forth, where only one or certain groups get to function at any one time. Perhaps only one group functions during this time window. Perhaps only certain groups, likely far apart, function during this time window. Perhaps only one group out of every adjacent set of groups functions during a time window. Regardless of the method of splitting up the time into windows, the idea is to prevent contamination, cross-talk and or noise by systematically setting up what happens when.

When pads or groups are not in use, particularly during time slotting operations, they can function as shielding. This can be achieved by connecting receivers, emitters, etc to ground, or to shielding circuitry in such a way as to make them function as active or passive shielding. Some microcontrollers, like Cypress PSOC's, enable pins to be remapped, which would make re-configuring pads into shields very simple. However, mux's or other switching circuitry could be used for this task. A variety of possibilities exist and shielding should be well known to someone skilled in the art of capacitive sensing.

A sensor with simplified groupings is visualized in FIG. 16. In this case, the emitter(s) are condensed into a single large electrode, (11). By condensing the emitters into a single electrode, the encoder is simplified. It may be desirable to place a barrier between the emitters and receivers, between different pad groupings and around the outside to reduce other sources of cross-talk and noise. Other shielding configurations are also possible.

A possible circuit implementation of the arrangement outlined in FIG. 16 can be seen in FIG. 17. The circuit is only mildly more complicated than in The Basics of Enablement. In this example, (11A) is connected to (11B), suggesting a single large emitter as seen in FIG. 16. At bare minimum, only a single MUX, component (09), is needed to choose between the two pathways. Vout is again the received signal. Vselect is used by the Processing Unit (08) to select the pathway of interest. The circuit can be slightly simplified from this figure, by allowing the two pathways to share access to a single load impedance. The load impedance can be connected after the MUX. Whichever path is connected gets connected to the matching impedance also. Whichever is not connected gets left floating.

A shared impedance can be left static regardless of the source. The impedance can also be adjusted for each source or grouping. Adjustments can be performed using the previously described impedance matching approach.

It may be advantageous to use two (or more) Signal Conditioning Units (06), Demodulation Units (07), etc, instead of a MUX (09) directing the signal to one Signal Conditioning Unit, component (06). In that case, the encoder can take multiple measurements simultaneously. Other configurations are also possible, depending on the designs needs of a particular situation. For instance, if more than two groupings are desired, a larger MUX (09) can be used or more Signal Conditioning Units (06), Demodulation Units (07) or other circuitry as appropriate to support the increased number of groupings.

Purpose, Use and Applications of Groupings

The concept of a group has been defined. Some methods of implementing groups have been discussed. Now, it is important to explore how multiple groupings can be used to enhance sensor operation. These are the methods of irregularity resilience and data optimization:

1. Irregularity Detection
   Singular Grouping Irregularity Detection
   Multiple Grouping Irregularity Detection
2. Irregularity Recognition
   Pattern Matching
   Pattern Catchall
   Pattern Learning
   Pattern Classification (acquisition)
3. Irregularity Adaption
4. Irregularity Avoidance
5. Selection and Data Optimization 1. Irregularity Detection Irregularity Detection refers to detecting sensor measurement errors or faults. In particular, errors cause by undesired alteration(s) to the scale, to the slider, or to the gap between the slider and the scale. Such alterations impair and interfere with normal sensor behavior and operation. For example, dirt or debris on the scale. This could also include damage to the scale itself. Perhaps wear, scratches, cuts and the like.

Such errors can corrupt and prevent proper position sensing in their proximity. It is important to detect such errors. There are some strategies to detect such errors.

A. Singular Grouping Irregularity Detection

Each grouping can detect an irregularity impacting its own self. A history of one or more past or recent measurements can be retained in memory. This way, the next or current measurement can be compared against a series of one or more previous measurements. This also allows the decoding of speed and acceleration from displacement. Speed can be evaluated or approximated by taking the derivative between different displacement measurements. Acceleration is likewise the second order derivative. Consistency can be evaluated using a number of metrics. For instance, the acceleration or velocity data can be used ensure points of discontinuity are caught. The next or current reading can also be compared to previous readings to determine consistency. If the measurements are inconsistent, for example one does not follow the others within some boundary of expectation, then by virtue the sensor has detected that an irregularity has occurred.

There are many ways of determining consistency. For instance, the next position measurement should be reasonably consistent with previous position measurements, speed and acceleration measurement(s) or approximations. For instance, using the last known position, the time interval between samples, and the velocity, it is possible to estimate the next position. If the next position measurement and the estimated position measurement do not agree closely, then an irregularity has likely occurred. The next measurement should also follow along the capacitive waveform. If it does not, then that is another metric indicative of an irregularity.

B. Multiple Grouping Irregularity Detection

Multiple groupings enable a micro processor or processing unit to cross examine measurements. By cross examining measurements, errors, faults and irregularities can be detected.

An early form of error detection from multiple receiver(s) can be seen in US Patent 4'743'902. In that patent, the author proposes taking two measurements, one from one receiver pad, and one from another. If the measurements deviate from one another, the author suggests that an error has occurred; likely from dirt or damage and that the sensor requires cleaning or servicing. This is a simple way of performing error checking. However, this method has some drawbacks and limitations. A problem impacting one pad may also impact the other. For example, dirt could easily smear evenly across both pads as the slider moves around. Both receiver pads may yield the same measurement, even if there is a problem. This would result in a false negative, or undetected error. It would take additional information, such as historical knowledge, to evaluate a fault condition in a scenario like this. Also, this approach does not provide the concept of choice. Nor does this approach teach using the detection to trigger automatic correction (adaptation, avoidance, etc).

To overcome prior art limitations and to enhance error detection, more levels of analysis are needed. The prior art compared the individual measurements between two individual receivers. In this embodiment, not only can the current data be compared, but also historical data. Historical data can be used to help develop velocity and acceleration. The position, velocity and acceleration data for any one or more groups can be compared.

Similarly, the acceleration or velocity data can be used to ensure no points of discontinuity occur. If it seems that the sensor position, velocity or other data has jumped or been otherwise inconsistent, then an error may have occurred. Moreover, the velocity and acceleration data can be used to project what the next measurement(s) should be. Functions like estimators can use historical and present data to approximate the position in the future. This approximation can be tested against the actual measurement or data. Deviations between these quantities will suggest cause for concern.

There are many ways of doing such comparisons and operations. A brief exploration of a few possible comparison operations are detailed as follows:

Basic Comparison of Measurements

1. Gather raw data from each grouping within a reasonable snapshot in time. It may be desirable to perform filtering operations on the data at this point in time.

Raw Data:

$\Phi_A$ measurement from grouping A $\Phi_B$ measurement from grouping B $\Phi_C$ measurement from grouping C etc Assume $$f(\Phi) = \text{Position}$$

where f(Φ) represents the mapping between a data measurement and position.

3. Evaluate $$f(\Phi_A) = X_A$$
$$f(\Phi_B) = X_B$$
$$f(\Phi_C) = X_C \text{ etc}$$

where $X_A$ is position suggested by the measurement data $\Phi_A$ from grouping A.

4. Given that groupings are a fixed distance apart, then $$f(\Phi_A) = X_A$$
$$f(\Phi_B) - \Delta_{BA} = X_{BA} = \hat{X}_A$$
$$f(\Phi_C) - \Delta_{CA} = X_{CA} = \hat{X}_A \text{ etc}$$

where $X_{BA}$ represents $\hat{X}_A$, an estimate of $X_A$ based on measurement B and the known distance between groupings A and B, $\Delta_{BA}$.

5. No measurement is perfectly without error, so some boundary of acceptable error should exist $$(X_B - X_{BA}) \leq \Delta$$
$$(X_C - X_{CA}) \leq \Delta \text{ etc}$$

for each $X_{BA}$, $X_{CA}$, $X_{CB}$, etc, that exist, Δ represents the boundary of acceptable error. Any deviations outside this boundary of expectation suggest an irregularity has occurred.

Comparison Using Historical Data

1. Given that f(Φ)=X, then $$\dot{f}(\Phi) = \dot{X}$$
$$\ddot{f}(\Phi) = \ddot{X}$$

using any reasonable method to compute derivatives. $\dot{X}$ is velocity and $\ddot{X}$ is acceleration.

2. Evaluate $$\dot{f}(\Phi_A) = \dot{X}_A$$
$$\dot{f}(\Phi_B) = \dot{X}_B$$
$$\dot{f}(\Phi_C) = \dot{X}_C \text{ etc}$$

No measurement is perfectly without error, so some boundary of acceptable error should exist $$(\dot{X}_A - \dot{X}_B) \leq \Delta$$
$$(\dot{X}_A - \dot{X}_C) \leq \Delta$$
$$(\dot{X}_B - \dot{X}_C) \leq \Delta \text{ etc}$$

where $\dot{X}_A$ should be equivalent to $\dot{X}_B$ and $\dot{X}_C$, etc. Δ represents the boundary of acceptable velocity error. Any deviations outside this boundary of expectation suggest an irregularity has occurred.

3. Evaluate $$\ddot{f}(\Phi_A) = \ddot{X}_A$$
$$\ddot{f}(\Phi_B) = \ddot{X}_B$$
$$\ddot{f}(\Phi_C) = \ddot{X}_C \text{ etc}$$

4. No measurement is perfectly without error, so some boundary of acceptable error should exist $$(\ddot{X}_A - \ddot{X}_B) \leq \Delta$$
$$(\ddot{X}_A - \ddot{X}_C) \leq \Delta$$
$$(\ddot{X}_B - \ddot{X}_C) \leq \Delta \text{ etc}$$

where $\ddot{X}_A$ should be equivalent to $\ddot{X}_B$ and $\ddot{X}_C$, etc. Δ represents the boundary of acceptable acceleration error. Any deviations outside this boundary of expectation suggest an irregularity has occurred.

Comparison Using Estimation

1. Evaluate an estimation of the next data using any reasonable method. For instance:

$$X[k] + \dot{X}[k] \cdot ts = \hat{X}[k+1]$$

where ts is the time between samples where $\hat{X}$ is a prediction or estimate where k refers to the $k^{th}$ sample.

This step uses a 1 step, $1^{st}$ order estimation technique to approximate the next position. It may be desirable to use historical data to estimate current and predict future data. If desired, a higher order estimator or any reasonable prediction method could be used. This estimation step can be done to estimate the position for every grouping.

2. Compare the predicted or estimated position to the measured position when possible:

$$(X[k+1] - \hat{X}[k+1]) \leqslant \Delta$$

No measurement is perfectly without error, so some boundary of acceptable error should exist. This is represented by Δ. The comparison can be performed for every grouping.

Other comparison techniques and methodologies can and do exist. In particular, it may be desirable to estimate using the raw data itself, instead of the position measurement the data points to. However, the key element here is the usage of multiple groupings to perform comparison and cross comparison using past and present data. Any data that violates the boundary of expectation or is inconsistent is suggestive of an error, fault or other irregularity.

When an irregularity is detected, the sensor can then perform internal corrective action through automatic irregularity avoidance, adaption, etc. The sensor can also inform the external user or controller of an irregularity.

2. Irregularity Recognition (Identification)

Many different types of problems or situations will leave a signature or pattern on the sensor performance in that area. Recent data can be retained and a waveform constructed. This waveform can be analyzed to identify patterns. Any patterns that cannot be identified can be put in their own catchall classification(s) or other categories.

How would pattern matching or signature identification be performed?There are many ways of performing signal identification. One way, for the purpose of proof of concept, is the mathematical correlation or cross-correlation of discrete signals. This type of correlation is commonly used in signal processing and should be well known to anyone skilled in the art of communication systems. The sensor could have many waveform patterns in memory, each corresponding to a known type of irregularity. If an irregularity occurs, such as when an actual measurement deviates from expectation, a comparison can be performed. A waveform segment, partial or whole, of the irregular measurements can be compared against the waveforms of known irregularities. The waveform with the highest correlation to the measurements can be considered the cause of the irregularity. If all correlations lie below some threshold, then the cause may be unknown. New or unknown irregularity waveforms can be added to memory, in a sort of learning feature (acquisition). Each new or unknown irregularity can be given a new and or arbitrary categorization in memory. Not only can future irregularities be compared to various waveforms with known cause, they can also be compared to various acquired waveforms with unknown cause.

Newly acquired waveforms of unknown cause can be distinguished from one another through a variety of methods. One way would be to establish a correlation threshold. If none of the existing waveforms in memory match the currently encountered irregularity with at least some meaningful degree of correlation, then the irregularity can be given its own new category. For example, unknown waveform #1, unknown waveform #2, etc. Thus, the cause of irregularities encountered in the future can be attributed against these unknown causes, like unknown cause waveform #2.

The waveforms in memory can also be superimposed in various combinations, then correlated against the irregular measurements to evaluate if some combination of expected irregularities have caused the current irregular measurements. Many other methods are also possible.

3. Irregularity Adaptation

When the sensor encounters an irregularity, it effectively encounters a blind spot. It expects and can understand a waveform of a certain shape, like a map. However, the irregularity is causing a waveform of a different shape. The sensor does not know how to interpret the new waveform, it does not have the right map for the situation. The sensor can use multiple groupings to adapt to the new waveform, to make a new map. Using groupings not or less impacted by an irregularity, the sensor can scaffold information and measurements from the regions it can interpret against the regions it can't interpret. In this way, it can generate a new map. With the new map, it can understand and interpret the new waveform. This way, the sensor can see its way through an irregularity. This can be achieved by:

1. Detection of irregularities.

2. While one (or more) groups are impacted by the irregularity, one (or more) groups not or less impacted by the irregularity can be used to gather measurements (eg, position) against which the irregularity's measurement(s) or waveform can be correlated.

3. Maintain a record in memory of the nature of the unique measurement(s) or waveform, as well as the new correlation or mapping caused by the irregularity and where along the scale it occurred.

4. In the future, the sensor can use the newly assigned mapping or correlation for that region of the scale. The sensor can use the new map to sense or help sense position in the areas where that irregularity has occurred.

In summary, the system has made visible what was blind. The sensor can now continue to use the irregular section to sense or obtain measurements.

4. Irregularity Avoidance

The sensor can also perform irregularity avoidance. If the irregularities are very localized, like debris (50) in FIG. 18, the sensor can skip around the irregularity. The sensor doesn't physically skip around the irregularity, but it can skip where its sensing or focus is around the irregularity. For instance in FIG. 18, the debris is under grouping A. While the debris is under grouping A, the sensor can use the data from grouping B to evaluate position. Likewise, as the slider moves along, the debris may find itself under grouping B instead. In this case, the sensor can switch from evaluating position using grouping B's data to using grouping A's data.

The sensor can detect irregularities using the previously discussed irregularity detection. The sensor can also remember or know in advance the locations and possibly other details (such as type, length, etc) about irregularities on the scale. Using detection and or advanced knowledge, the sensor can actively and intelligently select groupings away from, least impacted or not impacted at all by the problem or irregularity. To select groupings implies using the data from those groupings to evaluate quantities like position. When the sensor selects data not or least impacted by an irregularity, it selects for the best or most trustworthy data. In this way, the sensor avoids irregularities at any given point or interval in time and or space of the sensor's operation. Other methods of avoidance are also possible.

Regardless of the method of avoidance, the idea here is to change which data or data source(s) are being used to help construct desirable information. In particular, to exclude the use of data from bad sources and include the use of data from good sources at any given point in time and or space of the sensor's operation.

5. Selection and Data Optimization

The concept of choice requires a method of evaluating options. Evaluation requires a definition of best, a prioritization of goals and a balance therein. For position sensing, it is important to maximize exactness of a measurement. The best measurement is the most exact measurement. However, it is also true that a measurement can be faulty or in error. Thus the best measurement can also be seen as the most reliable or trustworthy measurement.

How to maximize exactness?

The result of having two pathways to choose between can be seen in FIG. 15. The steeper the slope, the greater the signal distinction between any two measurements. The greater the signal distinction, the more accurate the information. If a sensor has two (or more) sensor pad groupings to choose from, it can decide to measure any particular grouping and take regular measurements from every group. By taking the derivative between any two or more measurements from the same group, the sensor can evaluate slope for each grouping or source. By comparing slope, the sensor can evaluate the source, or perhaps source(s), with the greatest distinction at any point or interval in time and or space. Based on this approach, the best data is the data with the greatest distinction. Thus, the best source upon which to base a measurement is the source experiencing the greatest or steepest magnitude of slope at any point or interval in time and or space. A variety of other comparison or evaluation methods are also possible.

An example of a sensor selecting the group with the steepest slope can be seen as follows. The measurements from two offset groupings are visualized in FIG. 15. Plot (A) represents the complete waveforms from both groupings, grouping A (33A) and grouping B (33B). Plot (B) represents the measurements with switching action at the location of the vertical lines. Plot (C) represents the overall resulting waveform, when only the regions of interest are selected. R1, R2, R3 and R4 represent individual components of the waveforms from (33A) and (33B) that are used to make an overall resulting waveform. These components represent the regions or segments of steepest slope of (33A) and (33B). The overall waveform as seen in plot (C) allows for more accurate position information than either waveform by itself, a synergy of two or more groupings. It is also possible to perform analogous operation with more than two groupings or sources of waveforms.

How to maximize reliability?

The best data should always be the data not impacted by any sort of irregularity or error. However during sensor operation, situations may occur where no such data exists. Therefore, the next best data should be the data that can be derived from grouping(s) experiencing an irregularity that has already been adapted to. If no such situation exists, then the best data is the data from a group or groups that are experiencing the least deviation from expectation.

In some situations it may be desirable to arbitrarily define what data or data characteristics constitute best. This can be determined by different programs that define sensor behavior, or by user input.

In some situations, it may be desirable to know in advance where the best data exists. To do this, it is important that the sensor behavior is mapped or known completely in advance. Perhaps during a startup learning stage or perhaps even programmed from the factory. By knowing the behavior in advance, the regions with the most trustworthy and or most exact (steepest slope) can be isolated.

According to predetermined behavior or parameters, the sensor can switch which source(s) it uses to evaluated the desired quantities (eg, position). For example, perhaps when the readings from one grouping fall in a certain range, that source becomes the data source. When the readings fall outside of a target range, another group that is inside the target range becomes the data source. The main idea here is minimal or minimizing the processing required.

EMBODIMENT 2

(Pad Specialization)

This embodiment extends or builds on the concepts in the previous embodiment, Multiple Groupings. In the previous embodiment, additional pad groupings were used to enable measurement optimization, irregularity detection, adaptation and avoidance, as well as for other tasks. In that embodiment, pad groupings were reused, from one task to another. In this embodiment, it is proposed to break down tasks. To have specialized pads for particular purposes or goals, instead of, on top of or as well as the previously discussed pad grouping(s). This could be achieved through many mechanisms, such as but not limited to: unique pad sizing, shape, spacing, placement, connection, interconnection, configuration, reconfiguration, driving signal(s), etc.

Specialized pads will operate or collect capacitive measurements much like other pads or groups. The nature of their measurements will be in accordance with their niche. For instance, they may be used to detect misalignment information. To make sense of niche information, specialized models that correlate the data to the quantity being measured can be used. For example, a specialized pad used to measure mismatch like gap distance may feed a position model that utilizes the inverse relationship between gap distance, capacitance and position. Hence, the position information data can be updated by the data collected from specialized pads information.

What are some illustrative examples of specialized pads-?FIG. 18, FIG. 19 and FIG. 20 are examples of specialized pads. In FIG. 18 and FIG. 19, pads and pad pairs are placed on either side of the normal position sensing group(s), pads denoted by (14), (14A) and (14B), (14C) and (14D), respectively. In these examples, the pads are special because of their position. Being located on either side of the slider, they can perform prescanning. Irregularities a nd general scale terrain characteristics or conditions can be detected or evaluated. The irregularities can be detected before they come into vicinity of other specialized pads, non-specialized pads and groups; detecting a problem in advance of it manifesting itself. The degree of the problem can be evaluated using models specialized for irregularity identification, similar to that outlined in the previous embodiment. For instance, the physical length of an irregularity can be estimated using data from the prescanning pads. Using this information, the sensor can devise its response: to inform, to avoid, to adapt or some other desired action as per embodiment 1. Even the imprecise detection of irregularities will enable the sensor to engage in anticipatory actions or alert, avoidance or adaption, or some other behavior as desired. The sensor can even use prescanning to detect mismatch and hence update the position information.

In FIG. 18 and FIG. 19, the same prescanning pads are used to provide all irregularity detection. It may not be reasonable to re-use the same prescanning pads to detect multiple or all irregularities or fault conditions. It may be beneficial to have more than one specialized pad(s), each for different tasks or purpose.

In FIG. 20, pads are both specially placed and shaped. When compared to FIG. 19, pad (14A) through (14D) are split into (14A-1) and (14A-2), (14B-1) and (14B-2), (14C-1) and (14C-2), (14D-1) and (14D-2). These split pads allow for the normal prescanning and irregularity detection, as well as a more perceptive detection of misalignment. When in comparison to the split pads proposed in prior art US patent US 2015/0268790 A1, this embodiment's split pad manifestation is simpler. Only the specialized pads are split to detect misalignment, instead of all of the pads. When only certain pads are split, non-split pads and groups can be used to provide more accurate position measurements.

Imbalances of capacitance between pads, like (14A-1) and (14A-2) suggest misalignment. A variety of analysis techniques are possible if the connections to and with these split parts, (14A-1) to (14D-2), can be modified. This is possible with switch and or MUX components. These components can be discrete or built into existing microcontrollers, like the Cypress PSOC 4 chip series. Other components may also perform the necessary, on the go, routing changes. Split pads like (14A-1) and (14A-2) can be in parallel, as emitters in one moment. They can be in parallel as receivers in another. They can be in series as receivers, where a measurement for (14A-1) is taken independently of (14A-2). Measuring these pads separately makes the detection of imbalances and hence misalignment easier. Other routing approaches are also possible.

Using switches or MUXes, it is possible to change the specialized pad connections. The specialized pads can be switched from the scanning electronics to the shielding electronics. This provides the specialized pads more function, allowing them to act or operate as shields. These specialized pad functions can be time sliced with one another and or other sensor functions. For example, the sensor can take position measurements and prescanning measurements at different time intervals. During a position measurement, specialized pads could provide shielding. This specializes how the pads can function and configure. This eliminates or reduces the need for separate shielding electrodes.

It may also be desirable to isolate the function of specialized pad(s) from one another or from other parts of the sensor by driving them with signals orthogonal in time and or frequency to the signals used nearby, elsewhere and or in the rest of the circuit.

EMBODIMENT 3

(Absolute Positioning)

Many capacitive sensors do not have true absolute positioning. For instance, many keep track of the number of intervals traversed, a sort of coarse information.

Some capacitive sensors attempt to embed absolute information into the scale. Some of these methods include having two rows, one for relative and one for absolute information, like in US patents US 6'892'590 B1 and 4'879'508. Another method involves a single row with the occasional, and intentional missing pad, like in US patent US 2015/0268790 A1. These allow the sensor to evaluate position absolutely along the scale without manual indexing.

This embodiment means to provide absolute position information, embedded in the scale. This embodiment is possible based on two concepts:

1. Irregularity detection as outlined in previous embodiments.
2. Understanding and application of capacitive waveforms Where intentional features will exhibit unique capacitive behavior or waveforms. A sensor could know in advance what these unique waveforms are. By recognizing these intentional irregular features, the sensor can detect absolute position. As depicted in FIG. 34 and FIG. 35, intentional irregularities can be detected without multiple rows. Any one or more intentional features can be used as an index or marker for absolute positioning or referencing. These features can also be used to evaluate directional information.

The features proposed here include:

1. Unique pad shape and size
2. Connection Swap (crossover)
3. Unique Spacing

Where any one or more of these features can be embedded into the scale and used as an index or marker for absolute positioning or referencing. This is particularly possible with irregularity detection previously described.

1. Uniquely Shaped Pads, Sizing and Overlap

Prior art, US patent US 6'483'321 B2, proposes changing the rotor radius in a radial capacitive sensor to denote absolute position. However, there are other unique features that can also be embedded in the scale to denote absolute position or act as embedded features. Conformal mapping shows that capacitive behavior is based on the size and shape of the pads involved. Using this knowledge, it is a natural extension that uniquely shaped pads will exhibit unique capacitive behavior.

With the irregularity identification outlined in prior embodiments, pads of unique shape can be identified. A pad with an indent can be uniquely identified. A pad with a spur or outward extrusion can be uniquely identified. Pads that are wider can be uniquely identified. A pad that is thicker, perhaps there is a bit of solder on its surface (intentionally), can be identified. All these unique pad features can be identified because of their unique capacitive behaviors.

Likewise, the prior art details varying pad length in a radial sensor. Only a single rotor blade pad or segment needs to be varied in a radial sensor. Due to the circular nature, it will always function to denote absolute position. However, on a mechanically linear sensor it may be desirable to vary more than one blade along the length of the scale to effectively denote absolute position markers along its length. Therefore, it is useful to extend the prior art concept to mechanically linear capacitive sensors.

A visualization example of unique pad shape can be seen in FIG. 21. In this figure, the additional features are seen as over-sized pads, as denoted by components (21-1A) and (23-1A). The center of the over-sized pads is labeled (20-1), corresponding with the center of the waveform in FIG. 22.

As the slider, in FIG. 21, moves towards the right (in the positive X direction), the unique features will overlap with the grouping formed by (11B) and (12B). As the unique feature overlap increases, an additional capacitive behavior will be superimposed. This is visualized in FIG. 22, where the pseudo-sinusoid (34) is higher towards the center. The center peak represents where the feature (20-1) is underneath one of the slider's groupings, with 100% overlap. This upwards motion is the result of linear and fringing capacitive behavior. In FIG. 21, one feature was added. However, any number of features is possible.

By way of capacitive knowledge, the impact of a pad shape and or size feature can be known in-advance, allowing for identification. Since these features are intentional and can be identified using methods such as irregularity detection and acquisition, they are intentional irregularities, and can be used as a way of encoding higher order information into the scale.

2. Connection Swap (Crossover)

Figure 23:
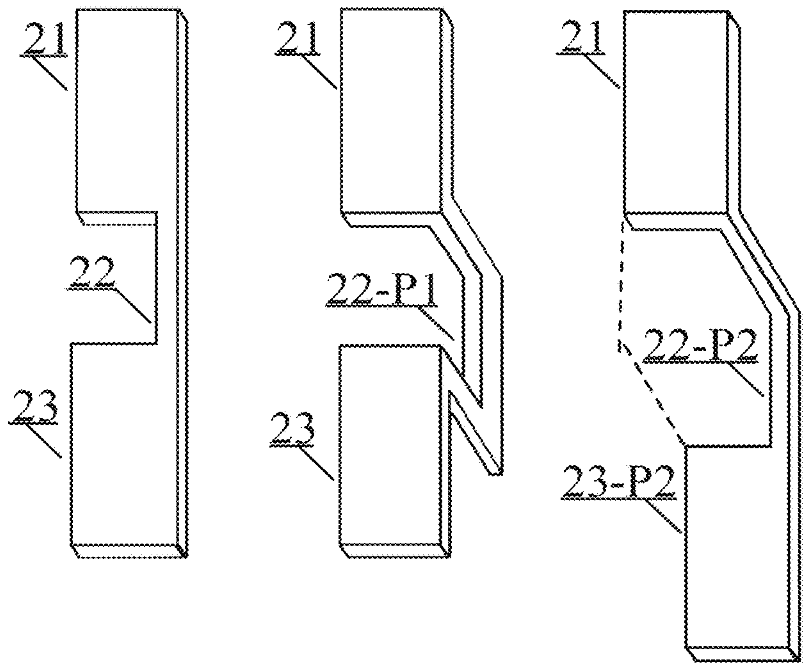

The scale pads are comprised mainly of three parts, as illustrated in FIG. 23. Component (21) couples capacitively with emitter(s). Component (23) couples capacitively with the receiver(s). Component (22) conductively connects (21) and (23) together.

Component (22) may be a simple copper trace on a PCB. Other manifestations are also possible. It may be on plane, as (22). It may be tucked away to the other side of the PCB, as (22-P1). It can also be tucked away like (22-P2), routing to a pad on another layer. Such a pad is denoted by (23-P2). Other routing is also possible.

A conductive connection lends itself to being modified, perhaps for the unique features previously mentioned. This modifications could be any variety of possibilities. A simple modification would be to swap or crossover the conductive connection, like in FIG. 24. In this figure, the deviation of (22-C1) and (22-C2) from how (22) is otherwise routed represents an example of crossover.

Why would crossover or cross connection be useful?

This cross connection could allow for unique signatures. A simple variation of this signature would detect the crossed pads as they enter the scanning or prescanning region. At this point, one of the crossed pads will lie outside of the scanning region. This will interrupt the normal connection between emitter and receiver. The capacitance will be measurably impacted when this happens. Many other variations are possible.

Different connections, such as having three pads crossed, can encode more information. The way in which cross connection(s) are done can encode binary information. For example, a straight and normal connection connection, like (22) as depicted in FIG. 24, could be a zero. A crossed connection, like (22-C1) and (22-C2) in FIG. 24, could be a one. In this sense, very distinct digital information can be embedded and then read, analogous to braille. It could encode a binary pattern for absolute positioning. Instead of connection swaps, other irregularities can also be used in an analogous way.

The cross connection could be used across layers. One way of doing this is clear in the comparison of FIG. and FIG. 26. FIG. 25 has no cross connection. It shows grouping A, components (11A) and (12A), capacitively coupling with scale pads, (21A) and (23A), respectively. It also shows grouping B, components (11B) and (12B), capacitively coupling with scale pads (21B) and (23B), respectively. FIG. 26 has a cross connection. (11A) and (21A) are coupled, as are (12B) and (23B). The coupled pairs are connected together, (11A) to (12B) due to crossover (22B-C). Similarly, (11B) and (21B) are coupled, as are (12A) and (23A). The coupled pairs are connected together, (11B) to (12A) due to crossover (22A-C). The emitter on one side has one signal. The emitter on the other side has another signal. The cross connection between layers is an identifiable irregularity. The system detects which side's signal it is receiving on each side, identifying the crossover irregularity.

This coupling between layers can occur for one, some or all of the pads in the scale. The coupling does not have to connect two adjacent pads, nor does it have to be the cross connection of two pads or pad groupings. Many different methods are possible. PCB traces and vias make this easy.

In prior art, US patent US 2015/0268790 A1, the author proposes an embedded feature for absolute positioning: missing pad(s) in the scale. It is possible to imbue an analogous feature but through a simpler alteration: removal of part of a scale pad or segment, scale component (22). This component can be removed for individual scale segments, elements or in localized areas of the scale. In this way, the normal crosstalk behavior between adjacent scale pads will be more readily preserved when compared to extracting an entire scale pad or segment. Even though crosstalk is generally undesirable, it is still part of the normal behavior of the scale segments or pads. The complete removal of a pad would upset this crosstalk and hence upset the accuracy of the models that describes the Capacitive Circuitry behavior. The behavior of the scale in the region surrounding the irregularity is more readily preserved when fewer alterations to the scale are made. Therefore, removing an individual (22) component for any individual segment on the scale will help retain normal sensor performance in the regions surrounding the intentional alteration or irregularity. The removal of (22) could represent a "no connection" case.

It may be desirable to offset the pads in the top (10A) and bottom (10B) of components in FIG. 26 analogous to how groupings (11A) and (11B) are offset in FIG. 13. This is to reduce unintentional cross capacitance or contamination between layers. Instead of offsetting pad groupings on the same plane, each plane is offset relative to one another by one half of an interval in the X-direction. This would make it easier to treat each side as its own pad grouping, like in embodiment 3.

There are variety of other methods to prevent layers from interfering unintentionally with one another. One way is to make (20) in FIG. 26 thick enough that the unintentional cross-capacitance between the top and bottom is negligible; capacitance is generally the inverse of gap distance. Other methods are also possible. To prevent interference, it may also be desirable if the signals on each side are orthogonal to eachother, such as in time or frequency. To prevent interference, signals and layer operations can also be time slotted.

The act of cross connection is like flipping, activating or triggering a switch. If the layers are offset, then even with the same emitted signal on both sides, the cross-connection will be an identifiable irregularity. If each layer is driven with a different frequency, phase or other characteristic, then the cross-connection will be an identifiable irregularity, even if the layers are not offset. The identifiable features will be noticed on an irregularity identification search. They do not even have to be explicitly recognized or categorized, just noticed.

The pattern of things noticed can be corresponded to information. For analogous example, with braille, one may feel a pattern of bumps. The height of those bump may be indeterminate or imprecisely determined. However, the presence of that pattern is detectable.

These cross-connections and related patterns can be detected and identified. Through identification, they become intentional feature(s) or irregularities. Such intentional irregularities can be used to encode higher order information into the scale. This higher order information can be used to communicate information such as absolute position.

3. Unique Spacing

Pads of varying size, shape, and cross connection were explored, but of uniform and repeating position. Every scale pad is positioned equidistant to each next pad. However, it is fully possible to imbue position information by spacing, placing and or distributing the scale pads in different ways. Different pad realizations will yield different capacitive distributions. These capacitive distributions can be 'read' and reverse analyzed to determine absolute position.

Chicken eyes have cones spaced very uniquely. Human eyes have a more regular and periodic cone spacing, with a higher clustering towards the center of the eye. However, chickens do not have such a regular cone spacing. Cones are grouped in periods. Within a period, the cones are spaced in random patterns. These patterns obey certain boundary rules. The cones are not too close together, nor too far apart.

The cone layout can be characterized by the following points: regular and dependable rules and boundaries, irregular and or unique spacing, and regular intervals.

Why are these points worth interest?

Random, patterned or unique spacing provides information. Specifically, it provides position information. As the chicken looks at an object, the object enters different regions of unique spacing. The unique spacing codes the visual information with spatial meaning. As the chicken moves its head, it can track an object, without moving its eyes in their sockets. The cone intervals, periods, are like clusters. The spatial position of the object is reflected by which clusters it lies inside of.

This kind of cone layout requires less processing. Chicken brains are very small. Human brains are much larger. This method of spatially coding information at the sensor level enables chickens to have a high level of spatial awareness without as much gray matter. The overhead is reduced.

Micro-controllers, when compared to computers, are similar to how a chicken brain is to a human brain. In order to achieve higher orders of performance, creative methods are needed. The pad spacing on a scale can be arranged using the principles of the chicken eyes. Any one or more individual pads can be spaced differently along the length of the scale. Pads of various size, shape and crossover can be distributed, placed and or spaced differently along the length of the scale. Provided the spacing, placement and or distribution enables unique capacitive behavior, then their uniqueness can provide absolute and relative positioning information. For example: too close together, and there isn't discernment, too far apart and the capacitive variation isn't strong enough to be meaningful. The goal is to strike the right balance of how features are distributed to optimize the resulting capacitive waveform.

The unique pad spacing can be detected and identified. Through identification, unique spacing(s) become intentional feature(s) or irregularities. Such intentional irregularities can be used to encode higher order information into the scale. This higher order information can be used to communicate information such as absolute position.

Asymmetric Features and Feature Groups

Unique and intentional features can be asymmetric in nature. The placement, distribution and order of these features can also be asymmetric in nature. Asymmetric features and feature distribution can be used to encode higher levels of information such as absolute position but in particular, direction information.

Approaching an asymmetric feature from one side may imply that the slider is traveling in the positive direction, or vice versa. For example, a scale pad could be trapezoidal in nature, as seen by components (21-1B) and (23-1B) in FIG. 27. Being trapezoidal, with a triangular shape on one side, the signal waveform will be uniquely more linear in that region.

Approaching an asymmetric distribution or order of features from one side may imply that the slider is traveling in the positive direction, or vice verse. For example, given two features, A and B, detecting A first, then B may suggest travel in the positive direction. Detecting B first, then A, may suggest travel in the negative direction. In this way, the asymmetric nature of a pattern, or how patterns can be arranged to be asymmetric imbues direction information.

Imprecise Data

The exact nature or type or degree of an irregularity may be unclear. However, that an irregularity has occurred is more clear. Likewise, that a specific pattern of irregularities has occurred is also clear or easier to discern than the details, nature, type and or degree of each irregularity in the pattern. Without necessarily identifying specific details about the irregularity or pattern of two or more irregularities, higher order information encoded in the scale can be detected based simply on the presence of an irregularity or pattern of irregularities. This constitutes a method of imprecise data—using a limited set of characteristics to evaluate higher order information.

In particular, a hysteresis approach can be used, like Yes/No irregularity. This can be seen as a means of detecting binary information encoded into the scale. For example, if an intentional irregularity is one interval long, then a pattern three intervals long could be irregularity, no irregularity, irregularity, or one-zero-one.

SUMMARY

In summary of the intentional features or irregularities discussed in Unique pad shape and size, Connection Swap (crossover) and Unique Spacing, any one or more of these unique features can be detected and or identified with the irregularity detection and recognition discussed in previous embodiments. The presence of any one or more features imbues the scale with higher order information. Details such as but not limited to the nature, presence and or type of irregularity can encode information. This higher order information can be used to communicate information such as but not limited to absolute position. In short, any one or more of the discussed intentional features can be used to provide referencing, indexing or marking for absolute positioning. Asymmetric features can also be used to imbue directional information. Imprecise detection of features can still be used to detect binary patterns.

EMBODIMENT 4

(Embedded Components)

Embedded Components: discrete components embedded in the scale, like resistors, capacitors, etc.

So far, scales for wireless sensors are entirely inert. Their behavior is entirely based on the shape, orientation, etc of the pads. However, scales in wireless sensors could have embedded components on/in them. These components could be resistors, capacitors, inductors, etc. In short, embedded components refers to discrete components. For instance, an additional resistive, capacitive or inductive load can be embedded in the scale. This is illustrated in FIG. 28, where component (42), an inductor, is placed between (21) and (23). The related circuit is summarized on the right hand of FIG. 28. The addition of discrete components can be used to change the electrical characteristics on the output, as another form of intentional irregularity. Even the addition of a load will alter the signal amplitude or capacitive circuitry impedance characteristics. A discrete capacitor could be added at the location of (42), increasing the localized capacitance, being very detectable in nature. The discrete components can vary from one scale pad set to the next, providing variance in electrical characteristics along the length of the scale in the X axis direction. The choice of component(s) and the specification of those component(s) can vary from one set or pad to another, side by side. A set can be defined as components (21), (22-PD), (42), (22-PD) and (23), making up one pad of the scale as visualized in figure FIG. 28. Many configurations are possible. At very high frequencies it may be desirable to embed microwave circuits instead of or as well as discrete components.

The use or purpose of such intentional irregularities is the same as discussed in the previous embodiment. In short, the application of these features into or onto the sensor scale provides a means of imbuing or encoding the scale with higher order information. The higher order information can be interpreted for absolute positioning, evaluating direction, and other purposes.

CONCLUSION

It will be apparent to one skilled in the art that modifications may be made to the illustrated embodiments without departing from the spirit and scope of the invention as hereinafter defined in the claims.

The embodiments of the invention in which an exclusive property or privileged is claimed are defined as follows:

1. A capacitive displacement sensor comprising:
- (A) a slider
- (B) a scale
- (C) an interpreting module
- (D) a measurement module
- (E) a capacitive circuitry module
- (F) pathways
- (G) groupings
- (H) electrodes
- (I) at least one emitter
- (J) at least one receiver wherein:
- said capacitive circuitry module is comprised of one or more said emitters, one or more said receivers and two or more said pathways, where:
  - each said pathway is comprised of said groupings forming a capacitive connection from said emitter to said scale to said receiver;
  - said groupings are comprised of one or more said electrodes;
  - said groupings placed separately from one another, where said electrodes comprising any particular said group are separate and not intermixed with said electrodes comprising any of the other said groups;
- said measurement module is comprised of measurement circuitry configured to interact with and extract one or more measurements from said capacitive circuitry module, where:
  - said measurement module is configured to obtain one or more measurements from each of at least two pathways of the two or more pathways;
- said measurement module is configured to output one or more measurements to said interpreting module;
- said interpreting module is comprised of processing circuitry or processing systems;
- said interpreting module is configured to obtain input, one or more measurements, from said measurement module;
- said interpreting module is configured to interpret one or more measurements to determine sensor displacement;
- said interpreting module is configured to interpret one or more measurements to determine sensor displacement;
- said interpreting module is configured to be able to evaluate two or more independent sensor displacements, where:
  - said interpreting module determines each independent sensor displacement by interpreting one or more measurements extracted by the measurement module from any pathway of the two or more said pathways to determine sensor displacement independent of interpreting one or more measurements extracted by the measurement module from any of the other pathways of the two or more said pathways.

2. The capacitive displacement sensor of claim 1, further comprised where said interpreting module is capable of performing one or more of the following:
- irregularity detection;
- irregularity recognition;
- irregularity adaption;
- irregularity acquisition;
- irregularity avoidance;
- data optimization.

3. The capacitive displacement sensor of claim 1, further comprised by:
- one or more specialized pathways, specialized at least by being located on one or both ends of the slider in the path of travel.

4. The capacitive displacement sensor of claim 1, further comprised of one or more intentional irregularities by the embedding of discrete or microwave components in or on the scale.

5. A method for monitoring a plurality of pathways using a capacitive displacement sensor of the structure found in claim 1, the method comprising:
- (A) said measurement module obtains one or more measurements from each of at least two pathways of the two or more said pathways, henceforth known as measured pathways;
- (B) said interpreting module interprets sensor displacement from one or more measurements from one of the at least two said measured pathways;
- (C) repeat step (B) for at least one more of the two or more said measured pathways.

6. The method of claim 5, further comprising a method of optimization according to exactness, the method comprising:
- (A) said interpreting module determines measurement slope for each said measured pathway
- (B) said interpreting module outputs sensor displacement based on one or more measurements from any measured pathway with the steepest slope of the two or more said measured pathways.

7. The method of claim 5, further comprised of the following steps:

(A) said interpreting module performs one or more comparisons of the following:

one or more measurements from any one or more said measured pathways;

one or more sensor displacements based on one or more measurements from any of the one or more said measured pathways;

one or more sensor velocities;

one or more first or higher order derivatives based on one or more sensor displacements from any one or more said measured pathways;

one or more first or higher order derivatives based on one or more measurements or measurement from one or more said measured pathways;

one or more estimates of any of the above;

said comparison comprises one or more of the following:

the difference between one or more measurements, estimates, displacements and or derivatives based on said measured pathway, and, one or more measurements, estimates, displacements and or derivatives based on another said measured pathway;

the difference between one or more measurements, estimates, displacements and or derivatives based on said measured pathway with one or more measurements, estimates, displacements and or derivatives based on that same said measured pathway across two one or more points in time;

where consistency between said compared measurements, estimates, displacements and or derivatives within a boundary of acceptable error is interpreted by said interpreting module to mean that no irregularity has been detected and inconsistency between said compared measurements, estimates, displacements and or derivatives outside of a boundary of acceptable error is interpreted by said interpreting module to mean that one or more irregularities have been detected, henceforth known as a detected irregularity or detected irregularities.

8. The method of claim 7, with the following steps added before and after, as follows:

(A) said interpreting module maintains a set of known irregularities, where:

said set of known irregularities is any one or more irregularities where said interpreting module maintains one or more characteristic input measurement to output sensor displacement models or waveforms that describe or represent that irregularity;

(B) the method from claim 7, where said interpreting module detects one or more irregularities;

(C) said interpreting module maintains a history of measurements from at least one said measured pathway where one or more of the said detected irregularities have been detected;

(D) said interpreting module performs one or more cross correlations between said history of measurements for one or more of the said detected irregularities and one or more of the irregularities from said set of known irregularities, where:

said interpreting module interprets any particular irregularity from the set of known irregularities as the recognized irregularity if the waveform or model that describes any particular irregularity from the set of known irregularities has a sufficiently high positive or high negative cross correlation with said history of measurements for said detected irregularity.

9. The method of claim 8, further comprising:

(A) said interpreting module interprets the quality of each measured pathway of the two or more said pathways according to the following metric, in descending order of quality:

pathway not impacted by any sort of irregularity or error;

pathway impacted by one or more irregularities that have been adapted to according to claim 8;

pathway impacted by one or more irregularities that have not been adapted to;

where any particular measured pathway of the two or more said measured pathways fall into one of these three quality categories;

(B) said interpreting module interprets sensor displacement one or more measurements from any pathway in the highest available quality category, where:

the highest available quality category is the highest quality category that has at least one pathway of that quality.

10. The method of claim 7 wherein said detected irregularity is or detected irregularities are interpreted to have occurred substantially at the location of one or more said measured pathways whose measurements, estimates, displacements and or derivatives is found to be inconsistent by said comparison.

11. The method of claim 10, further comprised of the following steps:

(A) if said interpreting module detects one or more irregularities in the past or present, said interpreting module keeps track of the location of where said detected irregularity is or was detected;

(B) said measurement module does not acquire one or more measurements from one or more said measured pathways substantially at the location of where said irregularity is or was detected; or said measurement module does not output to said interpreting module the one or more measurements from one or more said measured pathways substantially at the location of where the irregularity is or was detected; or said interpreting module does not interpret one or more measurements from one or more said measured pathways substantially in the location of where the irregularity is or was detected.

12. The method of claim 10, further comprised of the following steps:

(A) said interpreting module detects one or more irregularities in the past or present, said interpreting module keeps track of the location of where said detected irregularity is or was detected;

(B) said interpreting module, which interprets input of one or more measurements as inputs to generate output sensor displacement, creates an amended input measurement to output sensor displacement relationship for the location where said detected irregularity is or was detected, where:

(1) said interpreting module determines one or more sensor displacements from one or more measurements from one or more said measured pathways not substantially at the location of said detected irregularity, thereby establishing the output portion of said input measurement to output sensor displacement relationship;

(2) said interpreting module takes one or more measurements from the one or more said measured pathways substantially at the location of said detected irregularity, thereby establishing the input portion of said input measurement to output sensor displacement relationship;

(3) said interpreting module creates said amended input measurement to output sensor displacement relationship according to said input acquired in step (1), against, said output acquired in step (2)

(4) said interpreting module maintains the location of where said amended input measurement to output sensor displacement relationship applies (C) said interpreting module uses said amended input measurement to output sensor displacement relationship to evaluate one or more sensor sensor displacements from one or more measurements from any one or more said measured pathways substantially at the location where said amended input measurement to output sensor displacement relationship applies.

13. The method of claim 10, further comprised of:

(A) said interpreting module performs one or more cross correlations between said history of measurements for one or more of the said detected irregularities and one or more of the irregularities from said set of known irregularities, but the history of measurements for said detected irregularity does not have a sufficiently high positive or high negative cross correlation with any of the irregularities from said set of known irregularities;

(B) said interpreting module interprets that no irregularity has been recognized, and said interpreting module adds said history of measurements, or a model to represent said history of measurements, as a new irregularity to said set of known irregularities.

* * * * *